(12) United States Patent
Siddiqi et al.

(10) Patent No.: US 10,409,944 B2
(45) Date of Patent: Sep. 10, 2019

(54) GAME THEORY BASED RIP-UP AND RE-ROUTE TO IMPROVE GLOBAL ROUTING SOLUTIONS

(71) Applicant: King Fahd University of Petroleum and Minerals, Dhahran (SA)

(72) Inventors: Umair F. Siddiqi, Dhahran (SA); Sadiq M. Sait, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 97 days.

(21) Appl. No.: 15/870,049

(22) Filed: Jan. 12, 2018

(65) Prior Publication Data

US 2019/0220569 A1  Jul. 18, 2019

(51) Int. Cl.
G06F 17/50 (2006.01)

(52) U.S. Cl.
CPC ...... *G06F 17/5077* (2013.01); *G06F 17/5081* (2013.01)

(58) Field of Classification Search
USPC ........................................................ 716/129
See application file for complete search history.

(56) References Cited

U.S. PATENT DOCUMENTS

| | | | |
|---|---|---|---|
| 9,558,313 | B1 | 1/2017 | Siddiqi et al. |
| 2005/0138578 | A1 | 6/2005 | Alpert et al. |
| 2008/0170514 | A1 | 7/2008 | Hentschke et al. |
| 2009/0031275 | A1 | 1/2009 | Cho et al. |
| 2010/0146472 | A1* | 6/2010 | Srivastava .......... G06F 17/5077 716/129 |

OTHER PUBLICATIONS

Qinghua Liu, et al., "Pre-layout Wire Length and Congestion Estimation", DAC '04 Proceedings of the 41$^{st}$ annual Design Automation Conference, Jun. 2004, pp. 582-587.
Sadiq M. Sait, et al., "A stochastic evolution algorithm based 2D VLSI global router", Integration, the VLSI Journal, vol. 53, Mar. 2016, pp. 115-125.
Umair F. Siddiqi, et al.. "A Game Theory-Based Heuristic for the Two-Dimensional VLSI Global Routing Problem", Journal of Circuits, Systems and Computers, vol. 24, Issue 06, 2015.
Yiding Han, et al., "Exploring High-Throughput Computing Paradigm for Global Routing", IEEE Transactions on Very Large Scale Integration (VSLI) Systems, vol. 22, No. 1, Jan. 2014, pp. 155-167.

\* cited by examiner

*Primary Examiner* — Bryce M Aisaka
(74) *Attorney, Agent, or Firm* — Oblon, McClelland, Maier & Neystadt, L.L.P.

(57) ABSTRACT

A system and method for rip-up and re-routing a global routing solution includes determining, via processing circuitry, one or more rip-up and re-route (R&R) strategies for a net; decomposing, via the processing circuitry, multiple pins of the net into a plurality of subnets; decomposing a spanning tree of the net into paths for the plurality of subnets; determining, via the processing circuitry, a probability of success of each of the R&R strategies for one of minimizing a total overflow of a global routing solution or minimizing a wire length of the global routing solution; and applying one of the R&R strategies to the net based on the determined probability of success of said each of the R&R strategies towards improving the global routing solution, wherein the global routing solution includes a plurality of spanning trees for a respective plurality of nets of a global routing system.

20 Claims, 13 Drawing Sheets

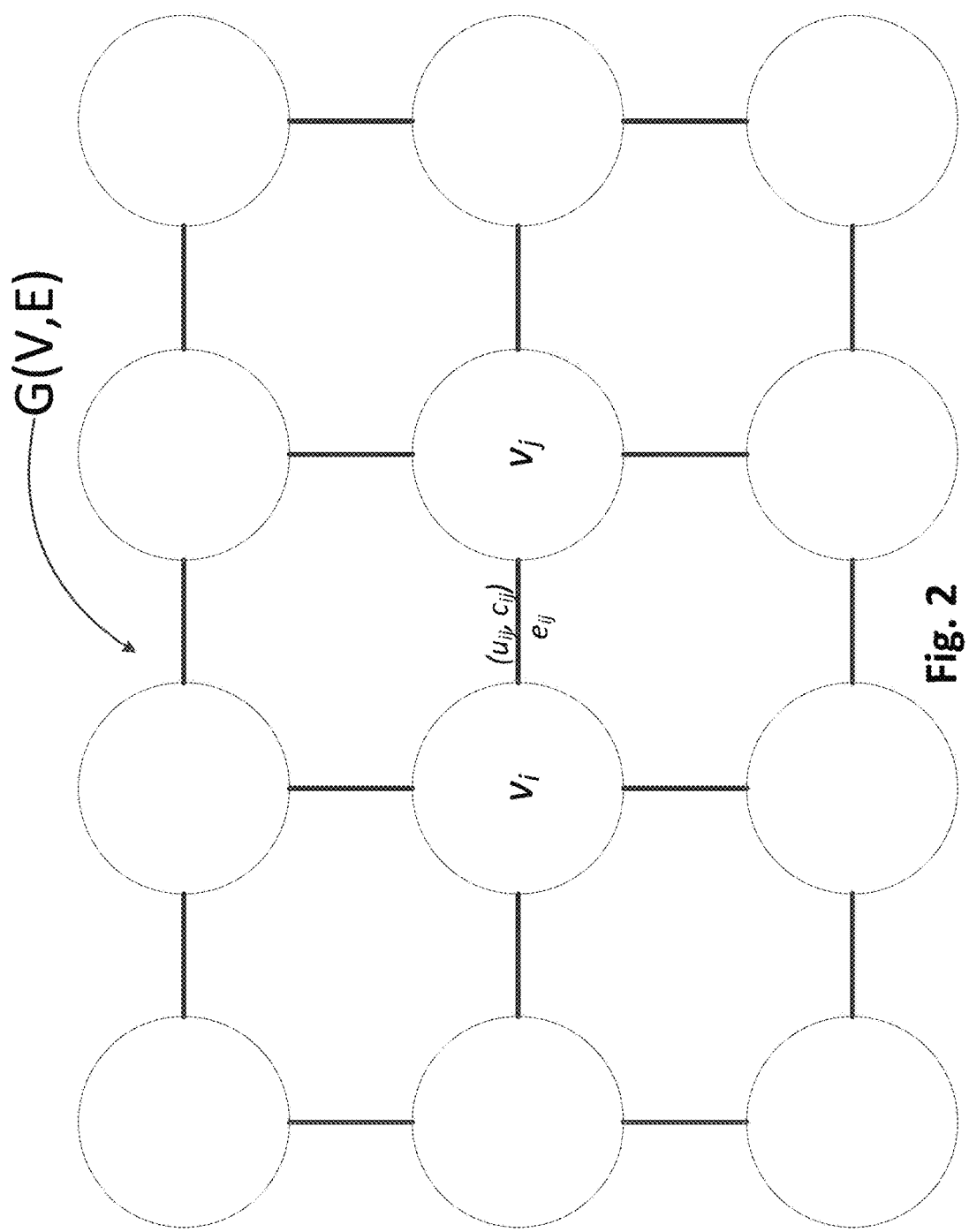

Input: $N$: set of all nets, $G(V,E)$: Grid graph, $T$: A given global routing solution
Output: $T$ global routing solution after improvement in total wire-length 1: while ($NE$ or maximum time is reached) do ← S1010
2:   Permute the order of nets in $N$ ← S1020
3:   for each net $n_i \in N$ do
4:     if off($n_i$) $> 0$ then ← S1030
5:       Compute the mixed strategy of $n_i$ which is represented by $M(n_i)$ ← S1040
6:       Using $M(n_i)$, select a GT pure strategy of $n_i$ which is represented by $s^*(n_i)$ ← S1050
7:       Rip-up and re-route $n_i$ using $s^*(n_i)$ and store the new spanning tree in $t_i^*$ ← S1060
8:       if off($n_i^*$) $\leq$ off($n_i$) then ← S1070
9:         $t_i = t_i^*$
10:       endif
11:     endif
12:   endfor
13: endwhile
14: return ($T$)

Fig. 10

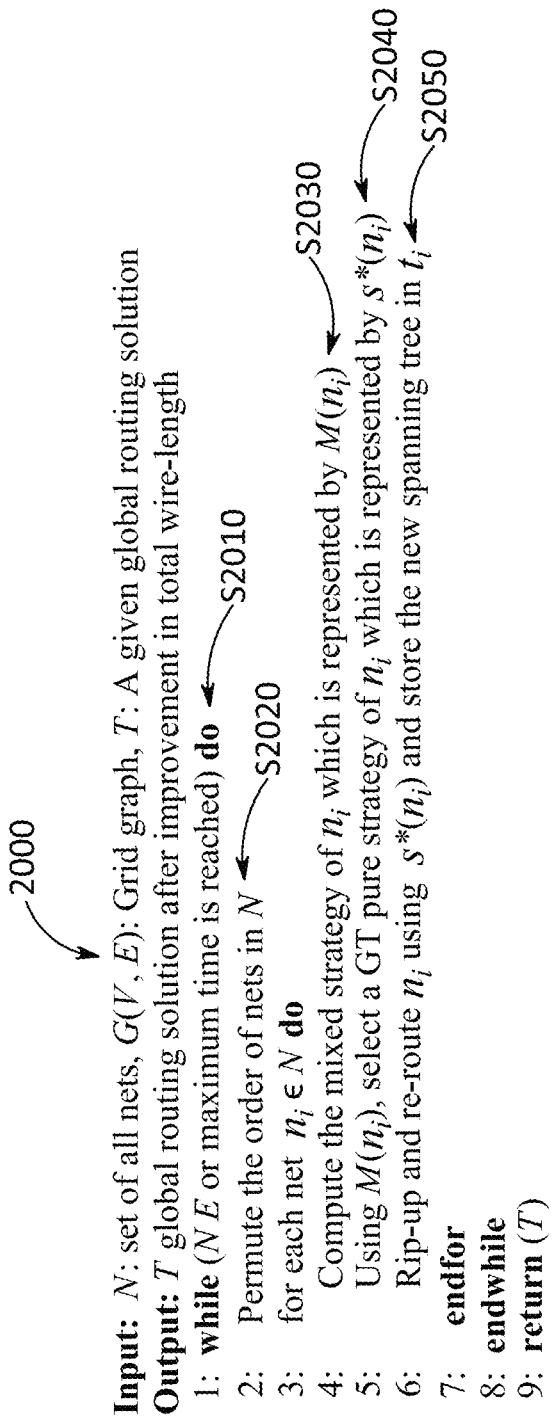

Input: $N$: set of all nets, $G(V, E)$: Grid graph, $T$: A given global routing solution
Output: $T$ global routing solution after improvement in total wire-length
1: while ($NE$ or maximum time is reached) do ← S2010
2:   Permute the order of nets in $N$ ← S2020
3:   for each net $n_i \in N$ do
4:     Compute the mixed strategy of $n_i$ which is represented by $M(n_i)$ ← S2030
5:     Using $M(n_i)$, select a GT pure strategy of $n_i$ which is represented by $s^*(n_i)$ ← S2040
6:     Rip-up and re-route $n_i$ using $s^*(n_i)$ and store the new spanning tree in $t_i$ ← S2050
7:   endfor
8: endwhile
9: return ($T$)

GAME THEORY BASED RIP-UP AND RE-ROUTE TO IMPROVE GLOBAL ROUTING SOLUTIONS

TECHNICAL FIELD

Global routing in a primed circuit board and in the physical design of Very Large Scale Integration (VLSI) is described. In particular, global routing based on game theory is described.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present invention.

The advances in nanometer Very Large Scale Integration (VLSI) have produced chips that contain billions of transistors within a very small die area. For example, the Intel Xeon processor uses a feature size of 20 nm and has over 5 billion transistors within a die size of just 661 mm². Chip limitations include interconnections between die because the devices have very small feature sizes. The routing step in the physical design of Integrated Circuits (ICs) is responsible for determining a suitable path for the interconnections. The interconnections are deposited or printed on the chip in order to connect different components. The routing process improves the chip timing as well as production costs. However, routing has become complex due to the presence of a very large number of components within a very small die area and a very small space available for interconnections.

The complexity of routing is reduced by dividing it into two steps, which are (a) global routing and (b) detailed routing. Global routing determines approximate paths for the interconnections and is a Non-deterministic Polynomial-time (NP)-hard problem. See T. Lengauer, *Combinatorial Algorithms for integrated Circuit Layout*. New York: John Wiley & Sons, Inc., 1990; S. M. Sait and H. Youssef, *VLSI Physical Design and Automation: Theory and Practice*. Singapore: World Scientific Publishers, 1999; *Iterative Computer Algorithms with Applications in Engineering*. California: IEEE Computer Society Press, 1999, each incorporated herein by reference in their entirety. In global routing, nets of wires (i.e. interconnections) are mapped to a coarse grid of global routing cells. Each global routing cell has a fixed horizontal and vertical capacity. An objective of global routing is to assign the nets while satisfying capacity constraints (horizontal and vertical) of the global routing cells. Each net is routed by generating a spanning tree that covers all of its pins. Detailed routing assigns segments of interconnections to specific routing tracks, vias, and metal layers in a manner which is consistent with the solution of global routing.

The International Symposium on Physical Design (ISPD) has conducted global routing contests in 2007 and 2008 and proposed several benchmarks for the nanometer scale VLSI global routing. See "ISPD 2007 global routing contest announcements;" G.-J. Nam, M. Yildiz, D. Z. Pan, and P. H. Madden, "ISPD placement contest updates and ISPD 2007 global routing contest," in *Proceedings of the 2007 international symposium on Physical design*, Austin, Tex., 2007, pp. 167-167; and "ISPD 2008 global routing contest," 2008, each incorporated herein by reference in their entirety.

Modern global routers generally include two processing steps. The first step is an initial routing of all nets in which the nets have been routed with little or no effort to minimize congestion. The second step is the Rip-up and Re-route (R&R) in which congestion is minimized or eliminated from the solution through ripping-up and re-routing the nets whose spanning tree has at least one congested edge. A conventional R&R process includes sequentially ripping-up and re-routing nets in a predetermined order. However, global routing problems are becoming complex, making it necessary to employ many enhancement techniques in the R&R process.

The R&R process in modern global routers includes many different types of enhancements in order to solve complex and large-size problems. The R&R process attempts to find a valid solution (i.e., a solution whose total overflow is zero), as well as minimize the wire length of the solution. A solution whose total overflow is zero is very likely to be successfully routed in the subsequent detailed routing step. The wire length of a solution has an effect on chip delay and manufacturing cost. Therefore, solutions of smaller wire length are highly desirable. The R&R processes of existing global routers can minimize the total overflow and wire length up to a certain extent, but they subsequently produce little or no improvement in total overflow and wire length.

FIG. 1 is a graph illustrating overflow versus runtime for a test case in which a benchmark is solved using a global router NCTU-GR 2.0. The global router has reduced the total overflow during the first hour, but could not make any further progress. These observations indicate that the R&R process requires enhancement.

SUMMARY

Embodiments described herein include a method based on Game Theory (GT) to rip-up and re-route (R&R) a global routing solution. The method can minimize the total overflow and wire length of a solution. Features include a non-cooperative sequential game whose players are nets. Each player is an intelligent object that can control the generation of its spanning tree in order to progress towards the minimization of total overflow or wire length.

The different routing methods available to nets act as the player's set of pure strategies. The mixed strategy of a net includes probabilities associated with each of its pure strategies. A pure strategy that has a high probability in the mixed strategy is more likely to be used in the re-routing of the net. Mixed strategies are computed based on estimations of how likely any pure strategy can improve the total overflow or wire length. The game continues until it reaches Nash Equilibrium (NE) or its maximum runtime. The NE is reached when the nets are unable to improve their overflow or wire length by using their strategies.

In one embodiment, a method of global routing includes determining, via processing circuitry, one or more rip-up and re-route (R&R) strategies for a net; decomposing, via the processing circuitry, multiple pins of the net into a plurality of subnets; decomposing, via the processing circuitry, a spanning tree of the net into paths for the plurality of subnets; determining, via the processing circuitry, a probability of success of each of the R&R strategies for one of minimizing a total overflow of a global routing solution or minimizing a wire length of the global routing solution; and applying, via the processing circuitry, one of the R&R strategies to the net based on the determined probability of success of said each of the R&R strategies towards improving the global routing solution, wherein the global routing solution includes a plurality of spanning trees for a respective plurality of nets of a global routing system.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 2 is a 2D grid-graph G(V,E) of a global routing problem according to one embodiment;

FIG. 10 is a pseudo code of the flow of execution of the R&R method of globa routing used to improve the total-overflow according to one embodiment;

FIG. 11 is a pseudo of the flow of execution of the R&R method of global routing used to improve the total wire-length according to one embodiment.

DETAILED DESCRIPTION

Figure 1:
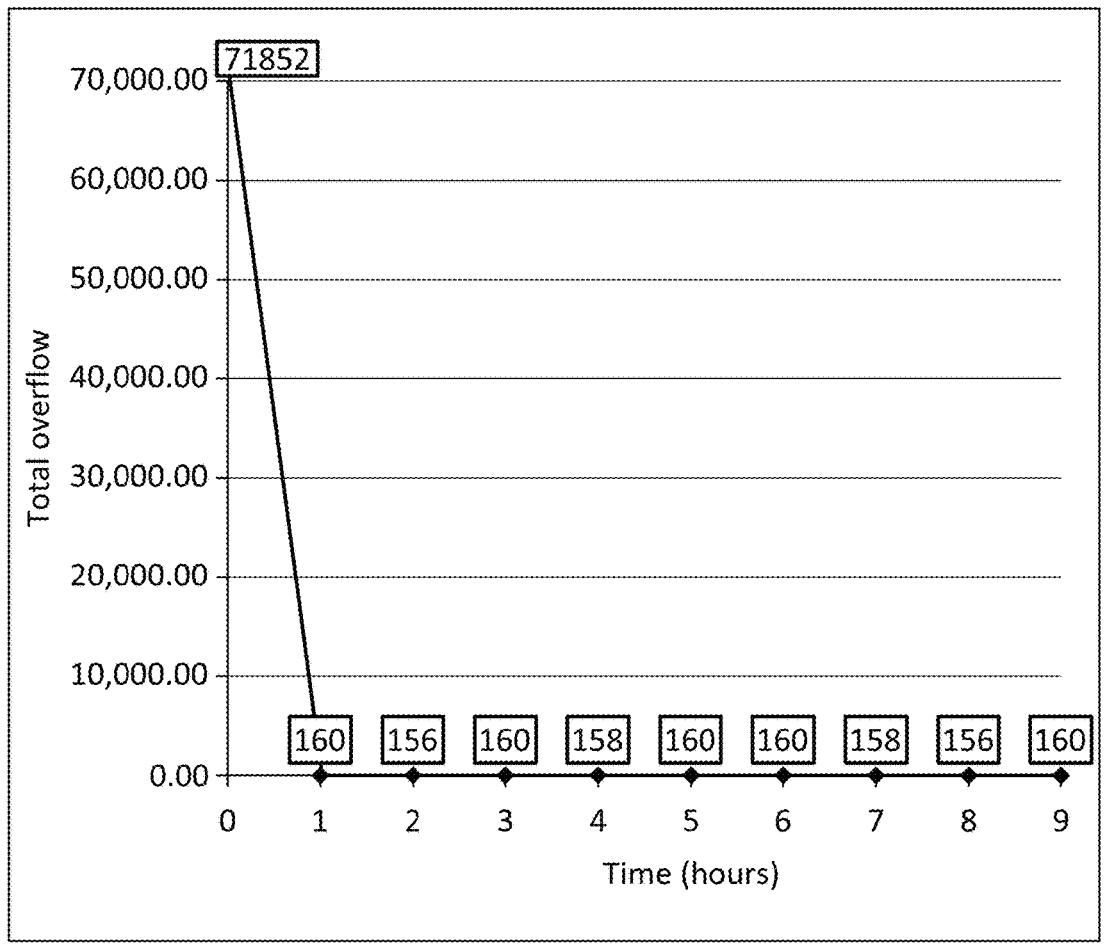
FIG. 1 is a graph illustrating overflow versus runtime according to one embodiment.

The following descriptions are meant to further clarify the present disclosure by giving specific examples and embodiments of the disclosure. These embodiments are meant to be illustrative rather than exhaustive. The full scope of the disclosure is not limited to any particular embodiment disclosed in this specification, but rather is defined by the claims.

It will be appreciated that in the development of any such actual implementation, numerous implementation-specific decisions need to be made in order to achieve the developer's specific goals, such as compliance with application- and business-related constraints, and that these specific goals will vary from one implementation to another and from one developer to another.

Modern global routers include two phases. The first phase is an initial routing of all nets. The second phase is the minimization of congestion and total overflow from the solution of the first phase, which is also called a rip-up and re-route (R&R) process.

A potential area of improvement to the R&R process is to employ methods from optimization and decision-making fields. See S. M. Sait and U. F. Siddiqi, "A stochastic evolution algorithm based 2D VLSI global router," *Integration, the VLSI Journal*, vol. 53, pp. 115-125, 2016, incorporated herein by reference in its entirety. This work employs Game Theory (GT) to minimize total overflow and wire length in the R&R process. See W. Jorgen W, *Evolutionary Game Theory*. Cambridge, Mass.: The MIT Press, 1995; E. N. Barron, *Wiley Series in Operations Research and Management Science: Game Theory: An Introduction* (2). New York, US: Wiley, 2013; and M. Wooldridge, "Does game theory work?" *IEEE intelligent systems*, vol. 27, no. 6, pp. 76-80, 2012, each incorporated herein by reference in its entirety.

Embodiments described herein have been evaluated by using GT-based an R&R method to enhance the results of two recent global routers. Experiments include two separate implementations. A first implementation attempts to minimize the total overflow and the second implementation attempts to minimize the total wire length.

The first implementation was evaluated on hard-to-route problems (i.e., unsolvable problems) of the ISPD 2008 benchmarks suite. Experimental results showed that the proposed method improved the total overflow of the first global router (NCTU-GR 2.0) by 0 to 16.2% and that of the second global router (BFG-R) by 6.1% to 23.6%.

The second implementation was evaluated on all problems of the ISPD 2008 benchmarks. Results showed embodiments described herein minimized the wire length of the solutions of the first global router (NCTU-GR 2.0) by 35 to 754 units (where 1 unit is equal to 1 edge of the routing graph) in different problems. The embodiments described herein improved the wire length of the solutions of the second global router (BFG-R) by 7462 to 15,587 units in different problems.

A different approach of GT has been used to solve the global routing problem. See U. F. Siddiqi, S. M. Sait, and Y. Shiraishi, "A game theory-based heuristic for the two-dimensional VLSI global routing problem," *Journal of Circuits, Systems and Computers*, vol. 24, no. 06, 1550082, 2015, incorporated herein by reference in its entirety. Instead of selecting the best Net Decomposition and Routing (ND-RT) method for each net, GT was used to decide which nets should be ripped-up and re-routed in order to minimize congestion. The net decomposition was not employed in that work and as a result, it solved only small-sized problems with a number of nets between 11K and 64K. The global router presented herein can solve global routing for large-sized circuits and can employ many different ND-RT methods. The number of nets in a large problem can range from 219K to 551K.

FIG. 2 illustrates a 2D grid-graph G(V,E) of a global routing problem. The set V includes all vertices and E includes all edges of the grid-graph. Each vertex $v_i \in V$ corresponds to a particular rectangular region (or cell) of a chip, and each edge $e_{ij} \in E$ corresponds to a boundary between adjacent vertices $v_i$ and $v_j$. The capacity of any edge $e_{ij} \in E$ is represented by $c_{ij}$, which is equal to a maximum number of nets or wires that can pass through it. The actual number of nets that are passing through $e_{ij}$ is called its demand and is represented as $u_{ij}$.

A set $N=\{n_0, n_1, \ldots, n_{m-1}\}$ contains the nets that should be routed on the grid-graph. Each net $n_t \in N$ has a set of pins $P_i$. A pin corresponds to a vertex on the grid-graph. A net can be routed on the grid-graph by a spanning tree, which connects all of its pins. The spanning tree of the net $n_i$ is represented by $t_i$ and $t_i \subseteq E$. A set T stores the spanning trees of all nets and is the solution to the global routing problem.

A primary objective of global routing is to route all nets while ensuring the capacity constraints of the edges are not violated, i.e., $u_{ij} \leq c_{ij}$, $\forall e_{ij} \in E$. For any edge $e_{ij}$, an edge becomes congested if its usage ($u_{ij}$) is greater than its capacity ($c_{ij}$). The congested edges contribute to the total overflow. For any edge $e_{ij}$, its overflow can be expressed as overflow($e_{ij}$) and its value can be determined using the following equation.

$$\text{overflow}(e_{ij}) = \begin{cases} u_{ij} - c_{ij} & \text{if } u_{ij} > c_{ij} \\ 0 & \text{otherwise} \end{cases} \quad (1)$$

The total overflow (tof) is defined as the total overflow of all edges, which can be computed as follows.

$$tof(T) = \sum_{e_{ij} \in E} \text{overflow}(e_{ij}) \quad (2)$$

The total wire length determines the resource efficiency or manufacturing cost of a valid solution. It can be computed as follows.

$$tot(T) = \sum_{t_i \in T} |t_i| \quad (3)$$

The overflow of a net $n_i$ can be computed using the following expression.

$$ofl(n_i) = \sum_{e_{ij} \in t_i} \text{overflow}(e_{ij}) \quad (4)$$

The wire length of a net is equal to the number of edges in its spanning tree, which can be determined as follows.

$$wl(n_i) = \sum_{e_{ij} \in t_i} 1 \quad (5)$$

A global router described herein executes three primary tasks: 1) ordering of nets, b) initial routing of nets, and c) R&R processing to eliminate congestion from the solution of initial routing.

Figure 3A:
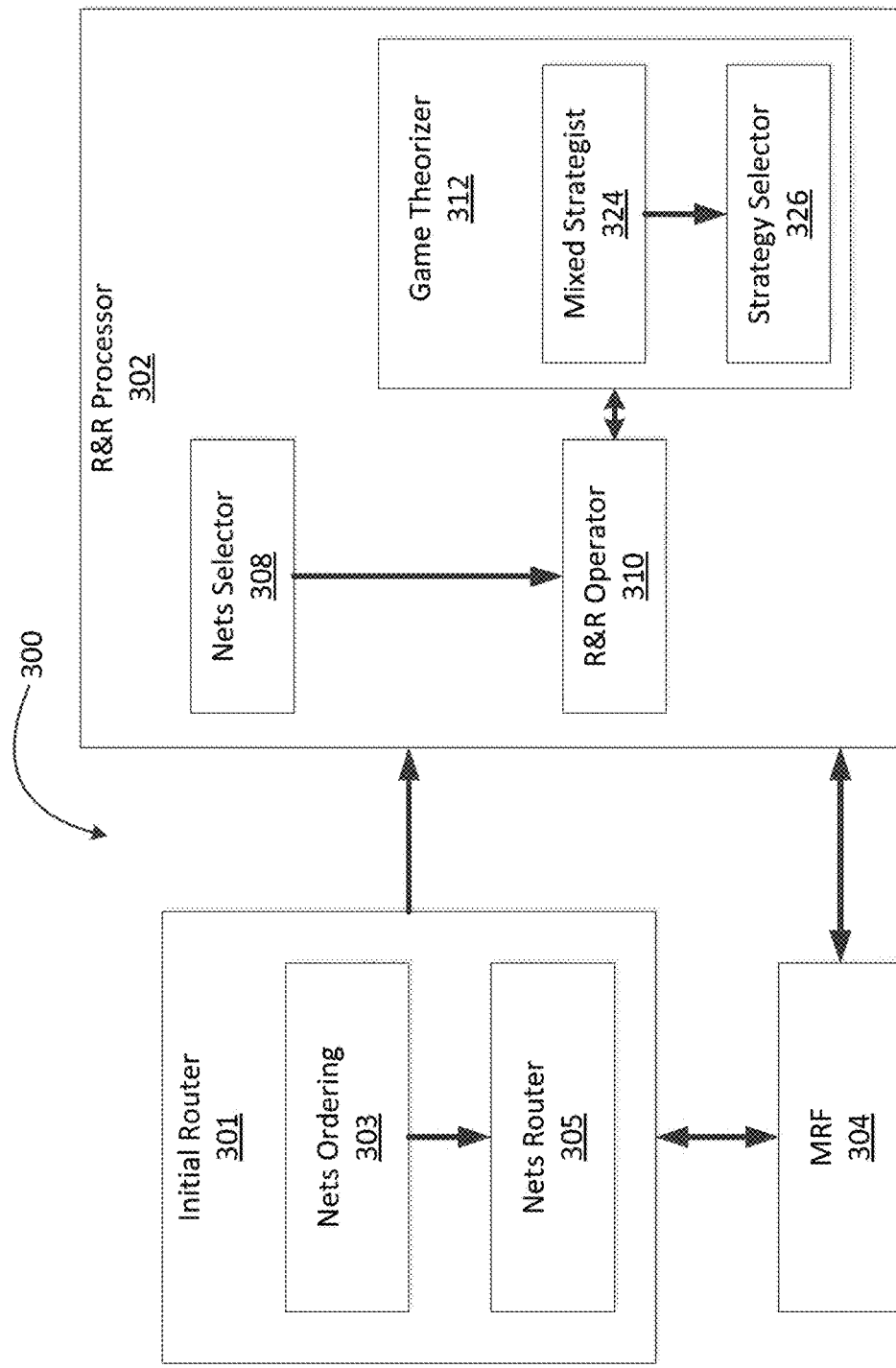
FIG. 3A is a block diagram illustrating an exemplary global router according, to one embodiment.

FIG. 3A is a block diagram illustrating an exemplary global router 300. The tasks of global router 300 are distributed among several components or modules. Each of the modules described herein may be implemented in circuitry that is programmable (e.g. microprocessor-based circuits) or implemented in dedicated circuits, such as application-specific integrated circuits (ASICs) or field-programmable gate arrays (FPGAs).

Global router 300 includes three modules: i) an initial router 301, ii) a Maze Router with Framing (MRF) 304, and iii) an R&R processor 302. These three modules integrate their functions to achieve global routing. The initial router 301 includes a nets ordering module 303 and a nets router 305. The nets ordering module 303 and the nets router 305 execute the tasks of ordering and routing the nets, respectively. The initial router 301 uses the MRF 304 to route the nets.

The R&R processor 302 includes a nets selector 308, a game theorizer 312, and an R&R operator 310. The nets selector 308 returns a set comprising all nets whose overflow is greater than zero. The game theorizer 312 applies a GT-based heuristic to determine the strategies by which nets can be ripped-up and re-routed in order to reduce the congestion or wire-length of the solution. The game, theorizer 312 includes a mixed strategist 324 and a strategy selector 326. A set of nets are selected for the R&R operator 310. The R&R operator 310 obtains the set of nets from the nets selector 308.

Figure 3B:
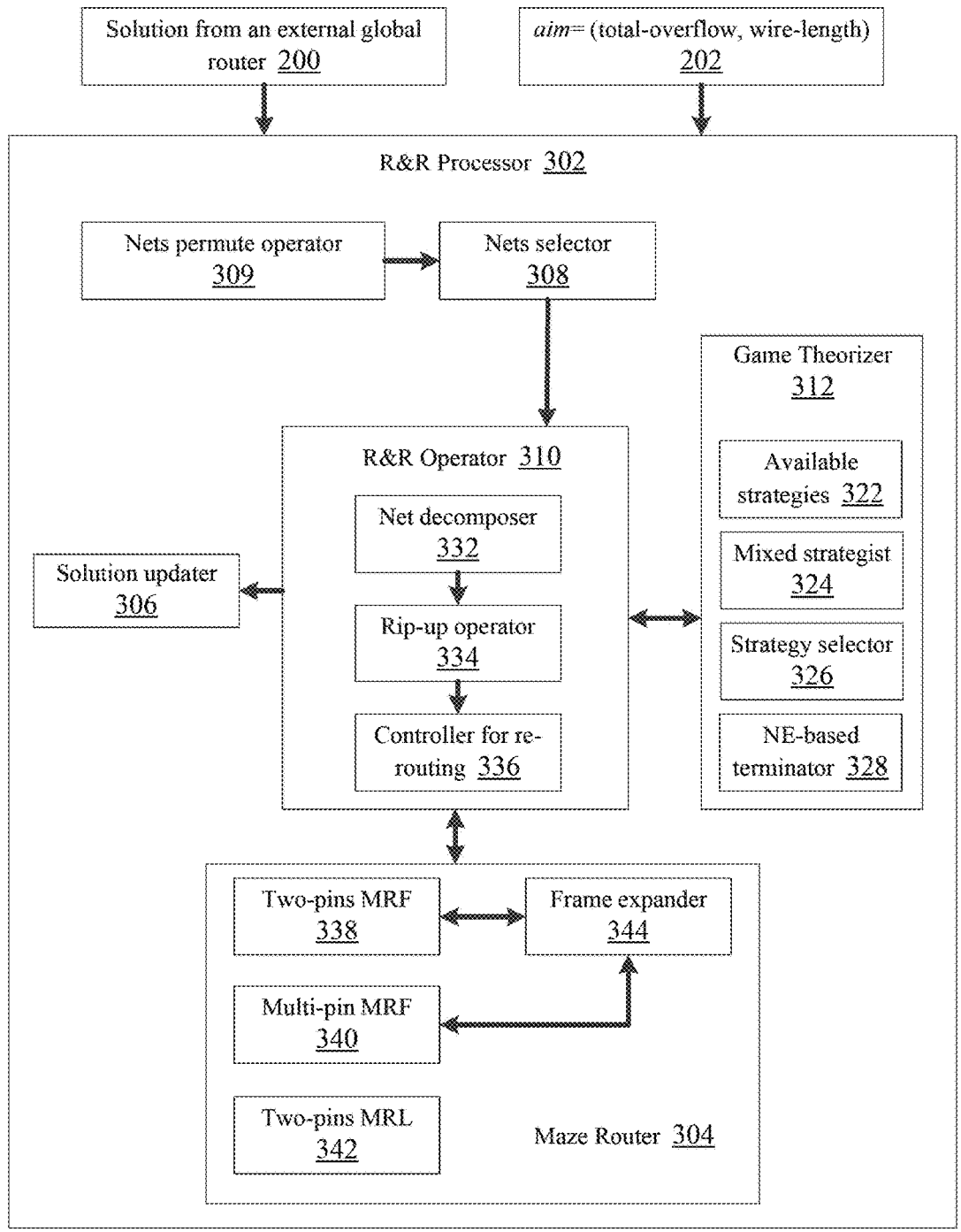
FIG. 3B is a block diagram illustrating an exemplary rip-up and re-route (R&R) processor of a global router according to one embodiment.

FIG. 3B is a block diagram illustrating a detailed view of an exemplary R&R processor 302. The tasks of R&R processor 302 are distributed among several components or modules. Each of the modules described herein may be implemented in circuitry that is programmable (e.g. microprocessor-based circuits) or implemented in dedicated circuits, such as application-specific integrated circuits (ASICs) or field-programmable gate arrays (FPGAs).

The R&R processor 302 accepts a solution from an external global router 200. The external global router could be Initial Router 301 of FIG. 3A. It also has an input aim 202 which decides its mode of operation. When "aim=total-overflow" then it tries to minimize the total-overflow of the input solution. When "aim=total wire-length" then it tries to minimize the total wire-length of the input solution. The R&R processor 302 includes a nets selector 308, a game theorizer 312, a maze router 304, an R&R operator 310, a solution updater 306, and nets permute operator 309.

The nets selector 308 selects the nets that have overflow greater than zero. The nets permute operator 309 permutes the ordering of nets. The game theorizer 312 applies a GT-based heuristic to determine the suitable strategies for the selected nets. The nets should be ripped-up and re-routed using their selected strategies in order to reduce the congestion or wire-length of the solution. The game theorizer 312 includes an available strategies block 322, a mixed strategist 324, a strategy selector 326 and an NE-based telminator 328. The available strategies block 322 contains all strategies which are available to the nets. The mixed strategist 324 computes the probabilities of each strategy available to the net. The strategy selector 326 selects a strategy for the net based on the probability values. The solution updater 306 compares the solution after every change with its previous value and restores the solution to its previous value if it is not better than or equal to its previous value. A set of nets is selected for the R&R operator 310.

The R&R operator 310 obtains the set of nets from the nets selector 308. The R&R operator 310 includes a net decomposer 332, a rip-up operator 334, and a controller for re-routing 336. The net decomposer 332 decomposes a multi-pin net into a plurality of subnets. It also breaks the spanning tree of a net into paths of individual subnets. The rip-up operator 334 deletes the paths of the subnets that have one or more congested edges. The controller for re-routing 336 handles the re-routing of the deleted subnets using maze router 304 and ensures that the spanning tree of the net becomes complete again.

The maze router 304 is responsible for re-routing the deleted portion of the subnets. It includes two-pins Maze Routing with Framing (MRF) 338, multi-pins MRF 340, two-pins Maze Routing for Length Improvement (MRL) 342, and frame expander 344. The two-pins MRF 338 is used to re-route subnets with an objective to minimize the total overflow. The multi-pin MRF 340 is used to re-route the deleted portion of the spanning tree (without considering decomposition into subnets) with an objective to minimize the wire length. The two-pins MRL 342 is used to route subnets with an objective to minimize the wire length.

A detailed discussion of the functional modules of FIG. 3B is described herein.

Net Decomposer 332

The nets that have more than two pins are called multi-pin nets. The multi-pin nets can be decomposed into two-pin subnets and routed. The two-pin subnets can be routed using shortest path algorithms, such as Dijkstra's algorithm, A*-search, etc. See T. H. Cormen, *Introduction to Algorithms*. Cambridge: MIT Press, 2009, incorporated herein by reference in its entirety. The runtime to route a multi-pin net can be significantly reduced by decomposing it into subnets. See A. B. Kahng, J. Lienig, I. L. Markov, and J. Hu, *VLSI Physical Design: from graph partitioning to timing closure*. Netherlands: Springer Science+Business Media B.V., 2011, incorporated herein by reference in its entirety. Enhancement methods can be employed by the R&R process with different global routers to improve their solution quality and runtime.

The decomposition of a multi-pin net can be performed with the assistance of a minimal Steiner tree or a rectilinear minimal spanning tree (RMST). The global router described herein uses RMSTs to decompose nets. The branches of the RMST join all pins of the net. In the decomposition of a multi-pin net, each branch of the RMST is considered as a subriet and the net can be completely routed by routing its individual subnets. The RMSTs are usually generated by successively adding branches into it. The RMST of a net $n_i$ (whose pins are represented as $P_i$) can be represented as $RMST_i$ which can be generated using the steps below.

1) Determine a pin $p_\alpha \in P_i$ which is identified as the initial pin. The $p_\alpha$ can he selected using a random selection method or using the pin which is most distant from all of the remaining pins.

2) Select two pins $p_u$ and $p_v$ such that $p_u \in RMST_i$ or if $RMST_i$ is null then $p_u = p_\alpha$ and $p_v \in \{P_i - RMST_i\}$ (i.e., the pins of $n_i$ that are not yet included in $RMST_i$). The selection of $p_u$ and $p_v$ can be performed using different criterion, such as Minimum Congestion (MC) or Random Selection (RS), wherein:

a) Minimum Congestion (MC): The estimated congestion of the frame enclosed by the pins $p_u$ and $p_v$ is used as a criteria. The estimated congestion is represented by $c_{est}$ and is described in more detail herein.
  b) Random Selection (RS) of pins: This is used to explore new spanning trees.

3) Create a branch whose starting and ending nodes are $p_u$ and $p_v$ and add the branch into $RMST_i$.

4) Repeat steps 2 and 3 until $\{P_i - RMST_i\}$ becomes null.

When the MC criteria is used in step 2 of the $RMST_i$ generation, the pair $p_u$ and $p_v$ has minium congestion compared to other pairs whose first element belongs to $RMST_i$ and the second element belongs to $\{P_i - RMST_i\}$. When the RS criteria is used, the two pins ($p_u$ and $p_v$) can be selected at random, such that $p_u \in RMST_i$ and $p_v \in \{P_i - RMST_i\}$.

Figure 4:
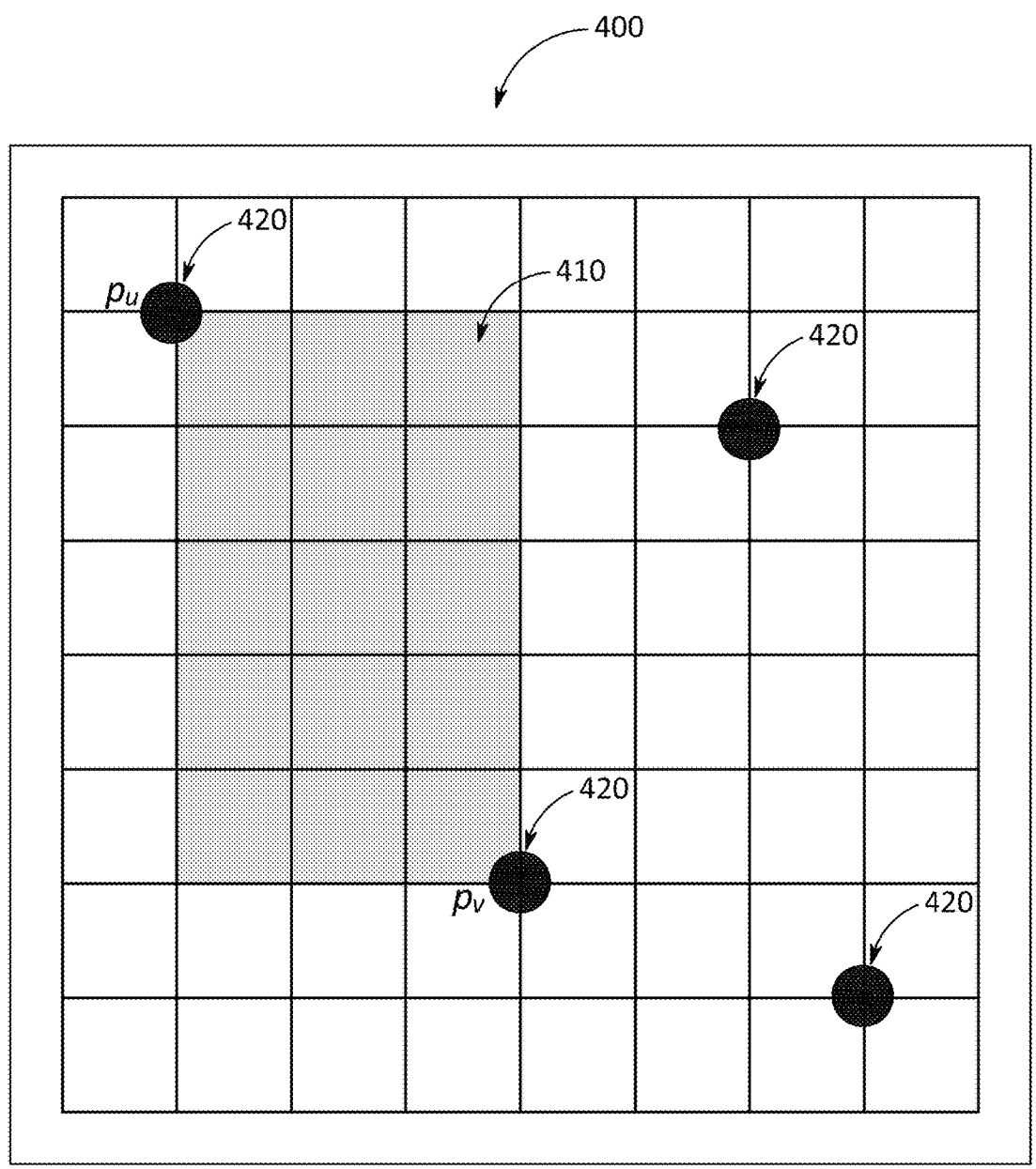
FIG. 4 illustrates a net with a frame positioned between two pins according to one embodiment.

FIG. 4 illustrates a net 400 including a frame 410 positioned between two pins 420, such as $p_u$ and $p_v$. An exemplary method to determine congestion between any two pins $p_u$ and $p_v$ is described as follows.

1) Create a sub-graph ($G_{sb} = (V_{sb}, E_{sb})$) that includes all nodes and edges that lie within the frame between pins $p_u$ and $p_v$.

2) Set the left-most bottom node of the sub-graph as the first node and the right-most top node of the sub-graph as the second node.

3) Consider all edges in the sub-graph being directed towards the second node.

4) For each node ($v_x$) in the sub-graph with two outgoing edges ($e_{xy}, e_{xz} \in E_{sb}$), compute the ratio $$rm(v_x) = \frac{\frac{u_{xy}}{c_{xy}} + \frac{u_{xz}}{c_{xz}}}{2}$$

5) If $v_x$ has just one outgoing edge ($e_{xy} \in E_{sb}$), compute $rm(v_x) = u_{xy}/c_{xy}$.

6) Normalize the ratios computed in Steps 4-5.

7) The congestion between pins ($p_u$ and $p_v$) is given by $$\frac{\sum_{x \in V_{sb}} rm(x)}{num_{sb}},$$

where $num_{sb}$ is the number of nodes which have at least one outgoing edge in $G_{sb}$. The value of congestion lies between 0 and 1.

Rip-Up Operator 334

The subnets that are congested i.e., their paths contain even a single edge whose usage exceeds its capacity should be deleted in the rip-up operation. As a result of the rip-up operator 334, the spanning tree of the net becomes incomplete and does not cover all pins. The spanning tree after the rip-up operation should be completed using the Maze router 304. The controller for re-routing 336 ensures that the spanning tree becomes complete again after the rip-up operation.

Two-Pins MRF 338

The Two-Pin Maze Routing with Framing (Two-Pins MRF 338) is a method of maze routing used in large-sized problems. This type of maze routing builds a frame or rectangular boundary around the two pins of the net. The frame is extended up to BSIZE grid points from the pins of the net in both directions. The maze routing of two pins can be performed using Dijkstra's algorithm The cost of any edge $e_{ij}$ that links cells $v_i$ and $v_j$ is represented by $cost(e_{ij})$, which can be determined using a history-based cost function according to the following.

$$cost(e_{ij}) = \left(1 + \frac{hist(e_{ij})}{iter}\right) \times cong(e_{ij}) \quad (6)$$

$$cong(e_{ij}) = 1 + \frac{penalty}{1 + e^{-slope(m_j - e_{ij})}} \quad (7)$$

The cost of an edge $cost(e_{ij})$ has two components which are separated by a multiplier sign. The first component is the history cost and the second component is the congestion cost (i.e., $cong(e_{ij})$). The function $hist(e_{ij})$ returns the number of iterations in which $e_{ij}$ was congested. The variable iter is the current iteration count. In congestion cost ($cong(e_{ij})$), the parameter penalty determines the congestion penalty that should be added to the cost of the edge if it is congested. The parameter slope determines the gradual change in the cost (up to the maximum value, which is equal to the parameter penalty) of an edge with an increase in its demand value. A large value of slope represents a steep change in the congestion cost of edges as their demand increases. Small values of slope represent a aradual change in the congestion cost.

Multi-Pin MRF 340

The Multi-Pin Maze Routing with Framing (Multi-Pin MRF 340) method generates a spanning tree for a multi-pin net without decomposing it into segments of two-pins. It iteratively builds a complete spanning tree In the first iteration, a pin whose Manhattan distance is a maximum from the remaining pins is selected as the source node. The remaining pins will be selected as destination nodes. A filling process is started from the source node and terminates as soon as any one of the destination nodes is reached. A retrace process constructs a path from the destination node to the source node, which is added to the spanning tree of the net. In subsequent iterations, the nodes which are already selected in the spanning tree are considered as the source nodes. Pins of the net that are still not covered in the spanning tree are considered as destination nodes. When the spanning tree covers all pins of the net, the routing of the multi-pins net has been completed. The cost of edges is determined using the same fonnulas as used in the Two-Pins-MRF method.

Two-Pins MRL 342

The Two-Pin Maze Routing for Length Improvement (Two-Pins MRL 342) method is used to improve the wire length of the nets whose spanning tree is already free from congestion. It is similar to the Two-Pins MRF 338 method, but has the following differences: (i) to route a net $n_i$, it uses a subgraph $G'=(V, E')$, where $E'$ contains only those edges which are included in the previous spanning tree of $n_i$ (i.e., $t_i$): and (ii) the path between the source and destination pins is determined using a shortest path algorithm, such as Dijkstra's algorithm on G'. Each edge in E' is assumed to have a unit weight. If the spanning tree of $n_i$ is $t_i$ before applying this method and the spanning tree created by this method is $t'_i$, then $t'_i \subseteq t_i$.

Frame Expander 344

The Two-pins MRF 338 and Multi-pin MRF 340 adjust the frame size based on the congestion in the frame. The maze routing methods find paths within their associated frames. Experiments have shown that most of the nets do not need an increase in the frame size. However, expansion of the frame size is necessary for a small number of nets. Therefore, the frame size should be expanded if the congestion in it becomes very high. The congestion estimation of a frame size of a net n, can be represented by $c_{est}$. See Y. Han, D. M. Ancajas, K. Chakraborty, and S. Roy, "Exploring high-throughput computing paradigm for global routing," *IEEE Transactions on very large scale integration (VLCI) systems*, vol. 22, no. 1, pp. 155-167, 2014, incorporated herein by reference in its entirety. The value of $c_{est}$ can be determined using the steps below.

1) Create a sub-graph ($G_{SB}=(V_{SB}, E_{SB})$) that contains all nodes and edges that lie within the frame of $n_i$ (where frame size is BSIZE).
2) Set the left-most bottom node of the sub-graph as the initial node and the right-most top node of the sub-graph as the final node.
3) Consider all the edges in the sub-graph are directed towards the final node.
4) For each node ($v_x$) in the sub-graph that has two outgoing edges ($e_{xy}, e_{xz} \in E_{SB}$), compute the ratio $$rm(v_x) = \frac{\frac{u_{xy}}{c_{xy}} + \frac{u_{xz}}{c_{xz}}}{2}.$$

5) If $v_x$ has only one outgoing edge ($e_{xy} \in E_{SB}$), compute $$rm(v_x) = \frac{u_{xy}}{c_{xy}}.$$

6) Normalize the ratios computed in Steps 4-5.
7) Determine $$c_{est}(BSIZE) = \frac{\sum x \in V_{SB} rm(x)}{num_{SB}},$$

where $num_{SB}$ is the number of nodes which have at least one outgoing edge in $G_{SB}$. The value of $c_{est}$ lies between 0 and 1.

If the $c_{est}$ of any frame size is more than a certain threshold value, the frame size should be expanded. The maze routing methods 2 Pins-MRF and mPins-MRF try to expand the frame size (i.e., BSIZE) to a new value BSIZE' until one of the following two conditions occur: (i) the value of $c_{est}$(BSIZE') becomes smaller than $c_{ratio}$, or (ii) the value of BSIZE' becomes greater than $c_{frame} \times$BSIZE. The $c_{ratio}$ is a real number whose value can lie between 0 and 1 and $c_{frame}$ is a non-zero positive integer. The implementations use $c_{ratio}=0.3$ and $c_{frame}=3$. From experiments, it has been found that large values of $c_{est}$(BSIZE) refer to highly congested regions and small values refer to less congested regions. Therefore, when $c_{est}$(BSIZE) is equal to or smaller than $c_{ratio}=0.3$, the frame is not congested and hence, no increment in its size is necessary. In congested regions, an increase in BSIZE usually reduces the congestion. However, in some cases, an increase in BSIZE can increase the runtime of maze routing. Therefore, an upper bound on the maximum increase in frame size is defined as $c_{frame}$ times its initial value. Experiments conducted have shown that values of $c_{ratio}=0.3$ and $c_{frame}=5$ work on most problems. However, a further improvement in performance of the global router is possible by fine-tuning the parameter values.

Game Theorizer 312

In the GT-based algorithm, the R&R process is modeled as a non-cooperative sequential game. In non-cooperative game theory, each player decides its strategy independently from other players. The sequential game models the sequential MR process in which one net goes through the R&R operation at a time. In the model, the nets act as players and the set N contains all players of a game. The Net Decomposition and Routing (ND-RT) methods available to a net form its set of GT pure strategies. An ND-RT method is used to rip-up and re-route a net. In an ND-RT method, the net-decomposition step breaks a multi-pin net into several two-pin subnets, then the routing step routes each subnet using a point-to-point shortest path algorithm such as Dijkstra's algorithm. When the total number of strategies is equal to d, the set of GT pure strategies of a net $n_i$ can be represented as $S(n_i)=\{s_0, s_1, \ldots, s_{d-1}\}$. The GT pure strategies of nets should cover a diverse set, of ND-RT methods to ensure the nets can build a large number of competing spanning trees.

GT Pure Strategies of the Nets

The GT-based method includes four strategies when its objective is total overflow and three strategies when its objective is wire length. New strategies can be added to it to further improve its performance. Each strategy includes three steps: ti) net decomposition; (ii) rip-up or partial rip-up; and (iii) re-routing. In partial rip-up and re-routing, the subnets of a net which have at least one congested edge will be ripped up and re-routed. The strategies are classified into two types based on the objective of the game (which is based on the input "aim.").

Available Strategies Block 322

The available strategies block 322 has the processing circuitry necessary to apply multiple strategies. The list of strategies available is described herein.

When aim="Total-overflow", the R&R processor should minimize the total overflow of the solution. Then, each net $n_i \in N$ can be ripped-up and re-routed using one of four different strategies as follows.

1) PRR (Partial Rip-up and Re-route)—Two-Pins-MRF (represented by $s_0$ in mathematical expressions)—only the branches of the spanning tree that have a congested edge will be ripped-up and re-routed. The re-routing is performed using Two-Pins-MRF 338 method as follows.
   a. Delete the paths of the subnets that have any congested edges.
   b. Regenerate paths for the deleted subnets using Two-Pins MRF 338 method.

2) PRR-Multi-Pins-MRF (represented by $s_1$ in mathematical expressions) includes the following steps.
   a. Delete the paths of the subnets that have any congested edges.
   b. Execute the Multi-Pin-MRF 340 method to route the net using the following considerations.
      i. The partial spanning tree includes the paths of the subnets which were not deleted and are considered as the initial solution in the Multi-Pin-MRF 340 method.
      ii. in the first iteration of the Multi-Pin-MRF 340 method, all nodes of the partial spanning tree are selected and treated as source nodes.
      iii. The pins that are not covered in the partial spanning tree are treated as destination nodes.
      iv. The Multi-Pin MRF 340 method should complete the spanning tree of $n_i$.
   c. Create a sub-graph $G'=(V', E')$, such that $e'=t_i$ and V contains all nodes $v_k$, such that $e_{xk}$ or $e_{xk} \in E'$, where $n_x \in V$ and $e_{xk}$ or $e_{kx}$ is an edge that joins nodes $n_k$ and $n_x$.
   d. Find a new path for all subnets whose paths were deleted in Step a), using any shortest path method on the sub-graph G'.

3) MC-PRR-Two-Pins-MRF (represented by $s_2$ in mathematical expressions) includes the following steps.
   a. Delete the existing subnets of $n_i$.
   b. Create new subnets using the net decomposition method described herein. The pairs of pins should be selected based on minimum congestion (MC) criteria.
   c. Create a sub-graph $G'=(V', E')$, such that $E'=t_i$ and V contains all nodes $v_k$, such that $e_{xk}$ or $e_{kx} \in E'$, where $n_x \in V$ and $e_{xk}$ or $e_{kx}$ is an edge that joins nodes $n_k$ and $n_x$.
   d. Find the shortest path between all subnets on the sub-graph G'.
   e. Delete the paths of the subnets that have one or more congested edges.
   f. Find the paths between the subnets that have been deleted in Step e) using the Two-Pins MRF 338 method.

4) RS-FIT-Two-Pins MRF (represented by $s_3$ in mathematical expressions) is similar to the MC-PRR-Two-Pins MRF method, except in Step b), the subnets are created using Random Selection (RS) criteria.

When aim="Total wire-length", the R&R processor should minimize the wire-length of the solution, then net $n_i$ has up to three strategies to rip-up and re-route its spanning tree to improve the wire length. The three strategies are as follows.

1. RR (Rip-up and Re-route)-Two-Pins MRL (represented by $s_0$ in mathematical expressions) includes the following steps.
   a. Find a path for each subnet using the Two-Pins RL 342 method. The resulting spanning tree is represented by $t'_i$.
   Rip-up the original spanning tree of $n_i$ which is $t_i$, and update $t_i$ to the new spanning tree $t'_i$.

2. MC-RR-Two-Pins MRL (represented by $s_1$ in mathematical expressions) includes the following steps.
   a. Create new subnets using the net decomposition method described herein. The pairs of pins should be selected based on MC criteria.
   b. Find a path for each subnet using the Two-Pins MRL 342 method, wherein the resulting spanning tree is represented by $t'_i$.
   c. Rip-up the original spanning tree of $n_i$ which is $t_i$, and update $t_i$ to the new spanning tree $t'_i$.

3. RS-RR-Two-Pins MRL (represented by s in mathematical expressions) includes the following steps.
   a. Create new subnets using the net decomposition method described herein. The pairs of pins should be selected based on RS criteria.
   b. Find a path for each subnet using the Two-Pins MRL 342 method, wherein the resulting spanning tree is represented by $t'_i$.
   c. Rip-up the original spanning tree of $n_i$ which is $t_i$, and update $t_i$ to the new spanning tree $t'_i$.

TABLE I

SET OF PURE STRATEGIES ($S_i$) OF NET $n_i \in N$.

| symbol | aim = total-overflow | | aim = wire-length | |
|---|---|---|---|---|
| | Name | Description | Name | Description |
| $s_0$ | PRR-Two-Pins-MRF | Partial rip-up and re-route using Two-Pins-MRF | RR-Two-Pins-MRL | Rip-up and re-route using Two-Pins-MRL |
| $s_1$ | PRR-Multi-Pins-MRF | Partial rip-up and re-route using Multi-Pins-MRF | MC-RR-Two-Pins-MRL | Net decomposition using MC, rip-up and re-route using Two-Pins-MRL method |

TABLE I-continued

SET OF PURE STRATEGIES ($S_i$) OF NET $n_i \in N$.

| | aim = total-overflow | | aim = wire-length | |
|---|---|---|---|---|
| symbol | Name | Description | Name | Description |
| $s_2$ | MC-PRR-Two-Pins-MRF | Net decomposition using MC, partial rip-up and re-route using Two-Pins-MRF | RS-RR-Two-Pins-MRL | Net decomposition using RS, rip-up and re-route using Two-Pins-MRL method |
| $s_3$ | RS-PRR-Two-Pins-MRF | Net decomposition using RS, partial rip-up and re-route using Two-Pins-MRF | | |

Table I summarizes the GT pure strategies of the nets under both modes.

The mixed strategy of a net includes computation of probabilities of all strategies available in that mode in available strategies 322.

This module functions differently under the two modes. Its function is described when "aim=total-overflow" and its function is described when "aim total wire-length".

Mixed Strategist 324

A net uses the GT mixed strategy to select a particular GT pure strategy. When the total number of GT pure strategies is equal to d, then the GT mixed strategy of $n_i$ can be represented as:

$$M(n_i) = \{m_0, m_1, \ldots, m_{d-1}\}, \text{ where } \sum_{k=0}^{d-1} m_k = 1$$

and $m_k$ is the probability of the selection of the GT pure strategy $s_k$. When aim=total overflow, then d=4 and when aim=wire length, then d=3. The probability ($m_k$) includes two components f&g. The computation of f component remains the same whether aim=total-overflow or aim=total wire-length. The probability of a strategy $s_k$ which is given by $m_k$ can be computed as follows.

$$m_k = f(n_i, k, \text{iter}) + g(n_i, k) \quad (8)$$

In Equation (8), "iter" refers to the current iteration of the game. The function $f(n_i, k, \text{iter})$ returns the number of iterations since $n_i$ selected the strategy $s_k$. When aim=total-overflow, the function $g(n_i, k)$ is described below and returns the number of iterations in which the application of strategy $s_k$ has improved the overflow. The values of both functions f&g should be equal to or less than the current iteration count (iter).

g ($n_i$, k)=# of iterations in which $s_k$ has minimized ofl ($n_i$) or ofl (T) {if aim=total overflow} (9)

When aim=total wire-length, the function $g(n_i, k)$ is described below:

g ($n_i$, k)=# of iterations in which $s_k$ has minimized tot(T) or wl($n_i$) {if aim=wire length} (10)

The values of f&g are upper bounded by FG_MAX since a game can continue for hundreds of iterations and in that case, their values continue to increase. As used herein, FG_MAX=10. The rationale behind the descriptions of f&g functions is based on experimental observation. The function f favors the selection of strategies which have not been selected for several iterations. When used in this way, all strategies have an opportunity to be applied for improving the solution. The function g favors the re-selection of strategies that have been found to be more successful than others. After the computation of probabilities of all strategies, each probability should be scaled by the sum of all probabilities, $$m_k = \frac{m_k}{\sum_{x \in M(n_i)} x}.$$

The scaling ensures that the condition $\Sigma_{x \in M(n_i)} m_k = 1$ is not violated.

Strategy Selector 326

The strategy selector 326 selects one strategy for the net based on the probability values. The strategies that have higher probability values are more likely to be selected. The selected strategy will be sent to the R&R Operator 310. The R&R Operator 310 is responsible for applying the selected strategy on the net.

NE-Based Terminator 328

The NT-based terminator 328 computes the payoff functions and Nash Equilibrium (NE). The GT based heuristic should terminate when the NE becomes true. The calculation of NE is different based on the value of input "aim". In the following, the method to compute the NE is described for both possible values of "aim".

Computation of Payoff and NE when Aim="Total-Overflow"

Each strategy is associated with a payoff function, which is the quantitative measurement of the benefit of using that strategy. The payoff function of a strategy $s_k \in S$ $(n_i)$ is described by Equation (11). The set of payoff functions can be represented as: $PY(n_i) = \{py_0, py_1, \ldots, py_{d-1}\}$, where $py_k$ is the payoff of strategy $s_k$. The payoff of any strategy should be equal to the gain in total overflow that can be achieved by using that strategy.

$Py_k = \text{ofl}(n_i) - [\text{ofl}(n_i)]^{s_k}$ if 'aim=total overflow' (11)

In Equation (11), ofl ($n_i$) represents the overflow of the net before the application of $s_k$ on it. $[\text{ofl}(n_i)]^{s_k}$ refers to the overflow of ni after the application of strategy $s_k$ on it. The NE of a game is reached when the available strategies no longer can minimize the total overflow. A game terminates upon reaching its NE. The conditions that lead to NE are as follows.

When 'aim=total overflow', NE can occur under the following three conditions where d is equal to four:

1) $py_k = 0$, for $k = \{0, 1, \ldots, d-1\}$, $\forall n_i \in N$, tof $(T) = 0$ 2) $py_k = 0$, for $k = \{0, 1, \ldots, d-1\}$, $\forall n_i \in N$, tof $(T) > 0$ 3) $py_0 = py_1 = py_2 = \ldots = py_{d-1} = K_i$, $K_i \neq 0$, $i = \{0, \ldots, m-1\}$, $\forall n_i \in N$ (m is the total number of nets in N and d is the number of strategies of each net).

The first condition refers to the situation in which the payoffs of all strategies of all nets are zero because the solution has become congestion-free (i.e., tof(T)=0). This is an ideal situation for the termination of the game. Condition 2 refers to the situation in which the payoffs of all strategies of all nets become zero, but the total overflow of the solution is greater than zero. Condition 3 refers to the situation in which the payoffs tier each net of all of its strategies become equal to a constant non-zero value. The game should not terminate at conditions 2 or 3 because they occur when the total overflow>0 (it is assumed that the global routing problem has a valid solution).

The payoff function should be modified to prevent termination of the game at the above-mentioned conditions 2 and 3. Whenever any of the conditions 2 or 3 occurs, the value of the payoff functions should be modified as follows: $py_k=py_k+\epsilon_k$, where k=0, . . . , d–1 and $\epsilon_k \in \{0, 1\} \in R$ and $\epsilon_x \neq \epsilon_y$, where x and y $\in \{0, 1, \ldots, d-1\}$ and x≠y. The GT-based algorithm also uses a maximum runtime limit to terminate a game before it can reach its NE since a game could run for a large amount of time before it reaches its NE.

The termination condition of the game is based on either reaching NE or reaching of a maximum allowed runtime. The NE of a game is reached when the values of payoff functions of all strategies of all nets becomes equal to each other. The NE should occur when the total overflow tof (T) of the solution becomes zero. However, it could also occur when tor (T)>0, in which case the game should continue until it reaches its maximum runtime.

Computation of Payoff and NE when Aim="Total Wire-Length"

Each strategy is associated with a payoff function, which is the quantitative measurement of the benefit of using that strategy. The payoff function of a strategy $s_k \in S(n_i)$ is described by Equation (12).

$$Py_k=wl(n_i)-[wl(n_i)]^{s_k} \text{ if 'aim=total wire-length'} \quad (12)$$

In Equation (12), $wl(n_i)$ represents the wire length of the net before the application of $s_k$ on it. $[wl(n_i)]^{S_k}$ refers to the wire length of $n_i$ after the application of strategy $s_k$ on it. The NE of a game is reached when the available strategies no longer can minimize the total wire length. When 'aim=wire length', the NE can occur under the following two conditions where d is equal to three.

1) $py_k=0$, for k={0, 1, d–1}, $\forall n_i \in N$,

2) $py_0=py_1=py_2= \ldots =py_{d-1}=K_i$, $K_i \neq 0$, i={0, . . . , m–1}, $\forall n_i \in N$ The first condition refers to the case when no further minimization of wire length is possible and the game should terminate at that point. Condition 2 occurs when further minimization of wire length is possible; a termination here should be avoided.

The payoff function should be modified in order to prevent termination of the game at the above mentioned condition 2. Whenever the condition 2 occurs, the value of the payoff functions should be modified as follows: $py_k=py_k+\epsilon_k$, where k=0, . . . , d–1 and $\epsilon_k \in \{0, 1\} \in R$ and $\epsilon_x \neq \epsilon_y$, where x and y $\in \{0, 1, \ldots, d-1\}$ and x≠y. The algorithm also uses a maximum runtime limit to terminate a game before it can reach its NE because a game could run for a large amount of time before it may reach its NE.

Solution Updater 306

When the 'aim=total overflow,' the new spanning tree created by the application of the strategy $s_k \in S(n_i)$ on $n_i$ does not directly replace the existing tree of $n_i$. Instead, t'$_i$ (a new tree) is first compared with $t_i$ (an existing tree) and t'$_i$ can only replace $t_i$ if it satisfies either one of the two conditions: (i) ofl(t'$_i$)≤ofl($t_i$); or (ii) tof(T)≤tof(T). When the 'aim=wire length,' the new spanning tree always replaces the existing spanning tree.

The GT-based method described herein was implemented using C++ and executed on an Intel Xeon 2.8 GHz based computer which has 64 GB of memory. The code was compiled using gcc 4.4.7 (Linux version). Most of the parameters used the values which are mentioned herein in which they are described. The values of the remaining parameters are set as follows: frame size (i.e., BSIZE)=10, penalty=100, and slope=1.2. A large value of slope is useful in the R&R process when the objective is to minimize congestion while compromising the wire length. The maximum runtime allowed to the GT-based algorithm was set at 10 hours. The GT-based algorithm was used to enhance the routing solutions of two modern global routers: (i) NCTU-GR 2.0, and (ii) BEG-R. The executables of the existing global routers were obtained and executed on the same platform as the GT-based algorithm described herein.

The experimental results of the enhancement of the total overflow and wire length are discussed herein. The global routers have many parameters and their solution quality depends on the fine-tuning of the parameter values. The literature of existing global routers shows results obtained under extensive fine-tuning of parameter values. The experiments either used the default values or adjusted values based on the instructions of the existing global routers. Existing global routers were used with different parameter values. The best results were obtained by following the instructions of the routers. The ISPD 2008 benchmarks were used in the experiments. The ISPD benchmarks were divided into two classes: hard-to-route and solvable problems. The problems that could not be solved completely by any of the existing global routers were classified as hard-to-route problems, and the problems that were solved by at least one global router are classified as solvable problems. Table II shows the characteristics of the problems in the ISPD 2008 suite. The problems not stated as hard-to-route were combined with the class of solvable problems.

TABLE II

CHARACTERISTICS OF THE ISPD 2008 BENCHMARKS [6, 7, 8]

| Name | Nets | Grids | vertical capacity | horizontal capacity | Number of obstacles |
|---|---|---|---|---|---|
| adaptec1 | 219794 | 227 × 227 | 70 | 70 | 84731 |
| adaptec2 | 260159 | 424 × 424 | 80 | 80 | 207257 |
| adaptec3 | 466295 | 774 × 779 | 62 | 62 | 770588 |
| adaptec4 | 515304 | 774 × 779 | 62 | 62 | 618473 |
| adaptec5 | 867411 | 465 × 468 | 110 | 110 | 264323 |
| newblue1 | 331663 | 399 × 399 | 62 | 62 | 110903 |
| newblue2 | 463213 | 557 × 463 | 110 | 110 | 449965 |
| newblue3[h] | 551667 | 973 × 1256 | 80 | 80 | 2016672 |
| newblue4[h] | 636195 | 455 × 458 | 84 | 84 | 181305 |
| newblue5 | 1257555 | 637 × 640 | 88 | 88 | 449189 |
| newblue6 | 1286452 | 463 × 464 | 132 | 132 | 174709 |
| newblue7[h] | 2635625 | 488 × 490 | 122 | 122 | 294732 |
| bigblue1 | 282974 | 227 × 227 | 110 | 110 | 16856 |
| bigblue2 | 576816 | 468 × 471 | 52 | 52 | 192068 |
| bigblue3 | 1122340 | 555 × 557 | 148 | 148 | 437789 |
| bigblue4[h] | 2228903 | 403 × 205 | 204 | 204 | 146696 |

[h]represents the hard-to-route problems

Enhancement of the Total Overflow

Figure 5:
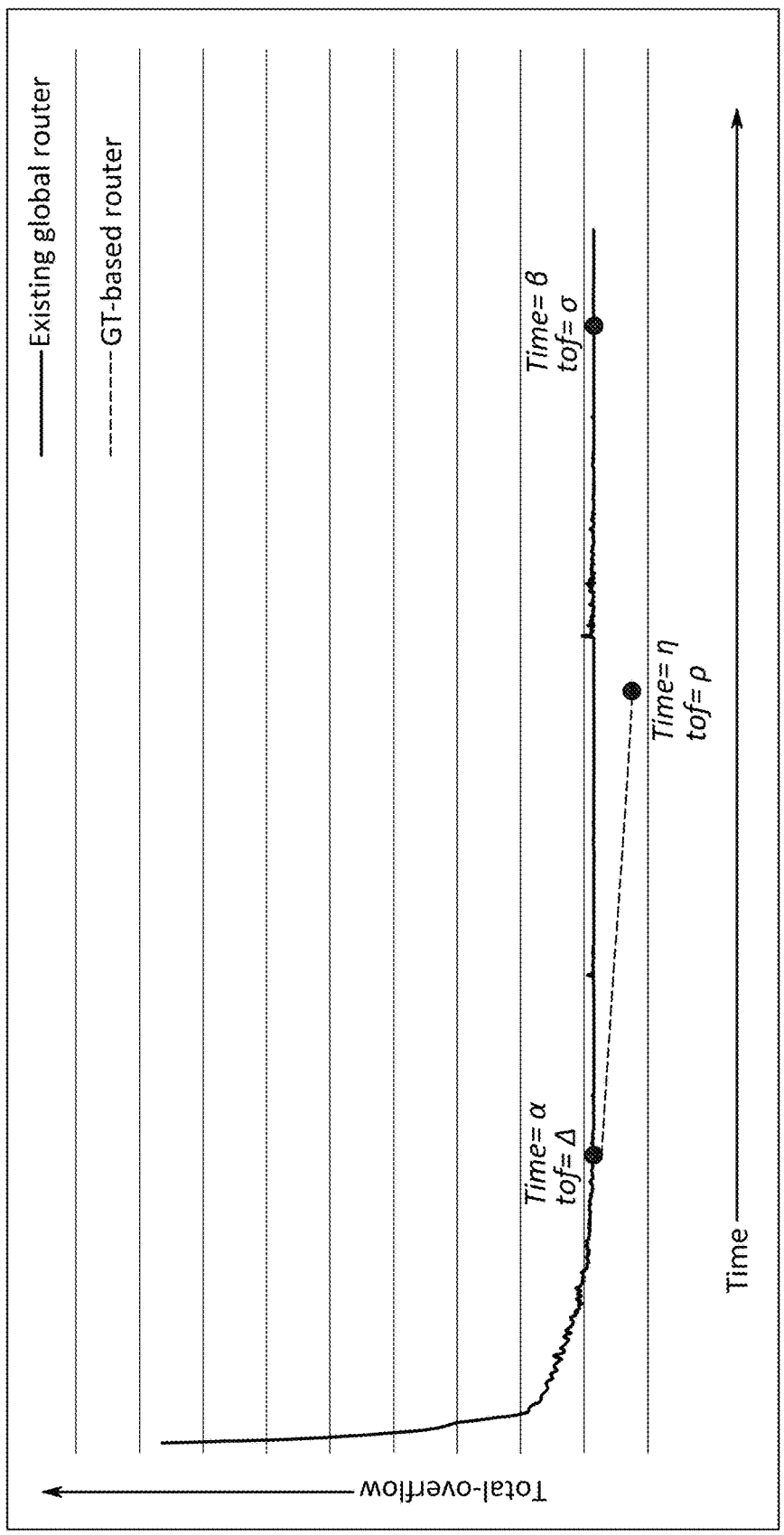
FIG. 5 is a graph illustrating a comparison of global routers according to one embodiment.

The existing global routers cannot completely remove total overflow from the hard-to-route problems of the ISPD 2008 benchmarks. FIG. 5 illustrates a generalized trend with which existing global routers minimize total overflow in hard-to-route problems. It also illustrates the role of the GT-based method in minimizing the total overflow. The existing global routers can quickly minimize the total overflow until it becomes small, as compared to its initial value. However, after reaching certain values, they no longer can continue to minimize the total overflow. The time a is represented as prior to the time in which existing global routers can significantly minimize the total overflow. The total overflow at time=$\alpha$ is represented by $\Delta$. The time $\beta$ represents the time which is greater than $\alpha$ and the time used to allow the existing global router to continue its search for a better solution under relaxed timing constraints. The total overflow at time=$\beta$ is represented by $\sigma$.

Experimental results have shown that the difference between $\sigma$ and $\Delta$ remains zero or very small, even when $\beta$ is much bigger than $\alpha$. The input to the GT-based method is a solution of an existing global router obtained at time=$\alpha$ and total overflow=$\Delta$. The total overflow of the solution from the GT-based method is represented by $\rho$ and the time taken by the GT-based method is represented by $\eta$. The benefit of the GT-based method becomes obvious when q is smaller than $\beta$ and $\rho$ is smaller than $\sigma$. The experimental results illustrate the efficiency of the GT-based algorithm.

Table III presents the experimental results of applying the GT-based method to the solutions of NCTU-GR 2.0. The columns $\alpha$, $\beta$, and $\eta$ present the runtime of NCTU-GR 2.0 and the GT-based method. The columns $\Delta$, $\sigma$, and $\rho$ present the total overflow of NCTU-GR 2.0 and the GT-based method. The results indicate in three out of four problems, the GT-based method has minimized the total overflow to values better than NCTU-GR 2.0.

Enhancement of the Wire Length

The GT-based algorithm can also minimize the wire lengths of solutions of existing global routers. The minimization of wire length becomes important after the total overflow becomes zero. The 2D global routing generally minimizes segment wire length, which is equal to the number of edges in a global routing solution. The GT-based method minimizes the segment wire length and refines the spanning trees of nets such that they can avoid congestion while using the least possible number of edges.

In experiments, BFG-R and NCTU-GR 2.0 were configured to produce solutions with minimum wire length. Their solutions were further minimized for wire length using the GT-based algorithm. In NCTU-GR 2.0, the parameter 'Wirelength·Optimization·Level' was set to 2000, which means the solutions should have a minimum possible wire length. The 2D global routing phase in NCTU-GR 2.0 minimized the segment wire length. In BFG-R, the routing method implicitly minimized the wire length. The wire length in BFG-R was controlled by adjusting values of Lagrange multipliers. The default values of Lagrange multipliers were used in the experiments. The BFG-R was executed with flag 'minBends' set to false and in this configuration, the 2D global routing minimized only segment wire length.

Figure 6:
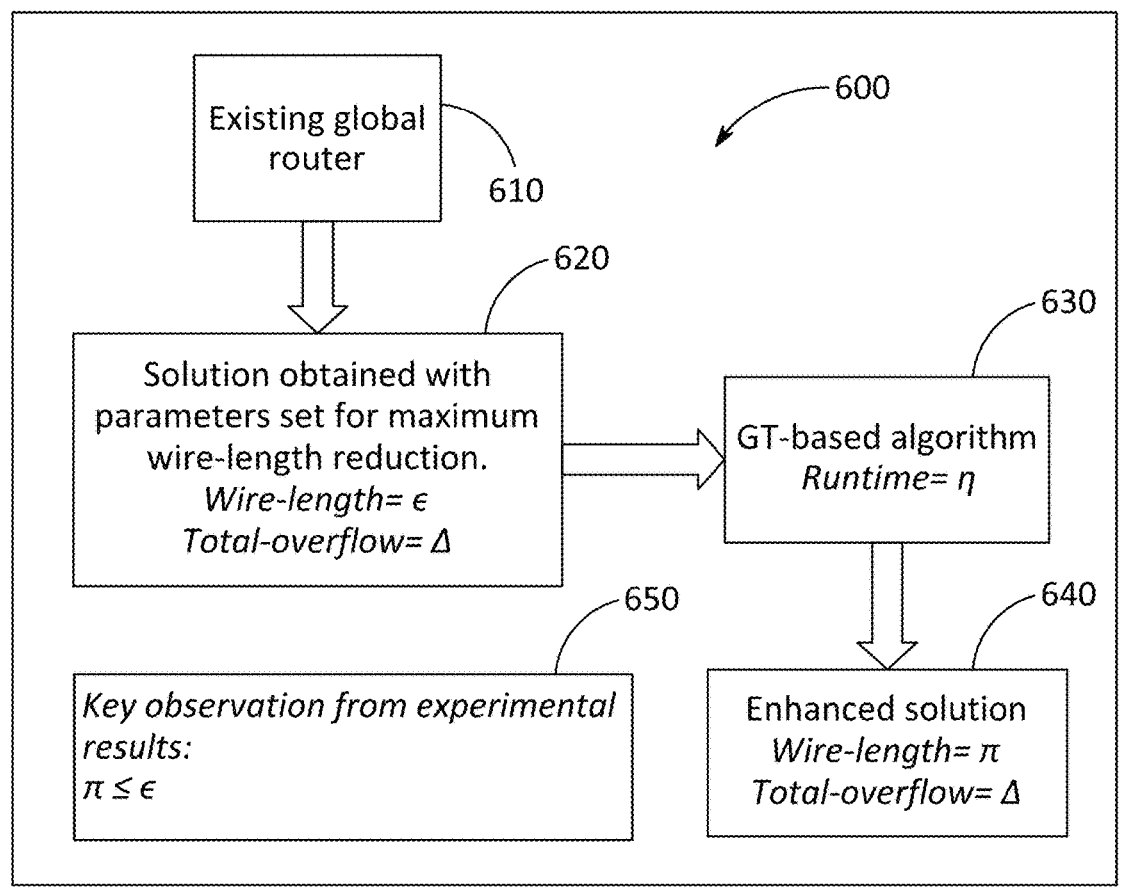
FIG. 6 is a flow chart illustrating a methodology used to evaluate wire length according to one embodiment.

The sixteen problems of the ISPD 2008 benchmarks were used in the experiments. FIG. 6 is a flowchart 600 illustrating the methodology used. In step 610, an existing global router was implemented. In step 620, a solution was obtained using the existing global router with parameters set for a maximum wire length reduction. En step 620, the wire length of the solution of the existing global router was denoted by $\epsilon$ and the total overflow was denoted by $\Delta$.

In step 630, the GT-based algorithm according to embodiments described herein was run, wherein the runtime of the GT-based algorithm is represented by $\eta$. In step 640, results of the GT-based algorithm were produced. The wire length of the solution enhanced by using the GT-based algorithm is denoted by $\pi$. The total overflow of the solution ($\Delta$)

TABLE III

RESULTS OF ENHANCEMENT OF TOTAL-OVERFLOW OF NCTU-GR 2.0 [1].

| Problem | NCTU-GR-2.0 | | | | Proposed Method | | | |
|---|---|---|---|---|---|---|---|---|
| | $\alpha$ (hours) | $\Delta$ | $\beta$ (hours) | $\sigma$ | $\eta$ (hours) | $(\alpha + \eta)$ hours | $\rho$ | Gain |
| newblue3 | 1.67 | 37118 | 12 | 36410 | 0.8 | 2.47 | 31786 | 4624 (or 12.69%) |
| newblue4 | 0.56 | 162 | 12 | 156 | 6.04 | 7.60 | 146 | 10 (or 5.13%) |
| newblue7 | 1.11 | 66 | 12 | 58 | 1.43 | 2.54 | 58 | 0 |
| bigblue4 | 1.11 | 214 | 12 | 210 | 8.37 | 9.48 | 176 | 34 (or 16.19%) |

Table IV presents the results of the enhancement of the solutions of BFG-R. The solutions that are enhanced using the GT-based algorithm clearly outperform the solutions produced by BFG-R in both total overflow and runtime. Table IV shows the maximum enhancement occurs in the problem bigblue4 at 23.61% and, the minimum enhancement occurs in the problem newblue3 at 6.13%. The runtime '$\alpha+\eta$' remains smaller than $\beta$ in all problems, which indicates the GT-based algorithm has improved both solution quality and runtime of the existing global router.

TABLE IV

RESULTS OF ENHANCEMENT OF TOTAL-OVERFLOW OF BFG-R [2].

| Problem | BFG-R | | | | Proposed Method | | | |
|---|---|---|---|---|---|---|---|---|
| | $\alpha$ (hours) | $\Delta$ | $\beta$ (hours) | $\sigma$ | $\eta$ (hours) | $(\alpha + \eta)$ hours | $\rho$ | Gain |
| newblue3 | 6 | 33864 | 24 | 33826 | 3.33 | 9.33 | 31752 | 2074 (or 6.13%) |
| newblue4 | 12 | 220 | 24 | 218 | 9.46 | 21.46 | 180 | 38 (or 17.43%) |
| newblue7 | 18 | 484 | 24 | 476 | 5.85 | 23.85 | 410 | 66 (or 13.87%) |
| bigblue4 | 9 | 438 | 24 | 432 | 8.98 | 17.98 | 330 | 102 (or 23.61%) | remained unchanged in executing the GT-based algorithm for wire length minimization. Key observations from experimental results 650 showed that 71 was less than or equal to ε.

Table V shows the results of minimization of the wire length of the solutions of BFG-R using the GT-based algorithm. The wire length is expressed as the number of edges in the spanning trees of all nets, which is also known, as 2D wire length. The results show that in all problems, the GT-based algorithm successfully minimized the wire length. The extent of wire length improvement, varied from 6462 to 15,587 edges. The runtime of the GT-based algorithm varied from 52 minutes to 10 hours.

TABLE V

RESULTS OF THE ENHANCEMENT OF WIRE-LENGTH OF SOLUTIONS OF BFG-R [2]

| Problem | Wire-lengths (# of edges) | | Minimization in wire-length | runtime (η) (hrs) |
|---|---|---|---|---|
| | BFG-R (ε) | Proposed algorithm (π) | | |
| adaptec1 | 3637993 | 3630174 | 7819 | 0.88 |
| adaptec2 | 3329538 | 3322077 | 7461 | 1.05 |
| adaptec3 | 9626138 | 9610551 | 15587 | 5.59 |
| adaptec4 | 9038086 | 9024805 | 13281 | 5.99 |
| adaptec5 | 10334271 | 10325740 | 8531 | 5.99 |
| newblue1 | 2437619 | 2430382 | 7237 | 1.91 |
| newblue2 | 4704731 | 4694124 | 10607 | 3.9 |
| newblue3 | 7906634 | 7899456 | 7178 | 9.99 |
| newblue4 | 8259747 | 8245408 | 14339 | 6.35 |
| newblue5 | 14873931 | 14863528 | 10403 | 9.99 |
| newblue6 | 10307724 | 10301262 | 6462 | 9.99 |
| newblue7 | 18371163 | 18371105 | 58 | 7.53 |
| bigblue1 | 3787010 | 3778741 | 8269 | 1.29 |
| bigblue2 | 4841759 | 4829347 | 12412 | 4.28 |
| bigblue3 | 7906634 | 7899456 | 7178 | 9.99 |
| bigblue4 | 12045517 | 12041594 | 3923 | 9.99 |

Table VI presents results of the minimization of wire length of the solutions of NCTU-GR 2.0 by the GT-based algorithm. The results illustrate the GT-based algorithm successfully minimized the wire length in all cases. The solutions of NCTU-GR 2.0 already had shorter wire lengths and therefore, the extent of minimization was less as compared to BFG-R. The extent of minimization varied from 35 to 754 edges. The runtime of the GT-based algorithm varied from 43 minutes to 10 hours.

TABLE VI

RESULTS OF THE ENHANCEMENT OF WIRE-LENGTH OF SOLUTIONS OF NCTU-GR 2.0 [1]

| Problem | Wire-lengths (# of edges) | | Minimization in wire-length | runtime (η) (hrs) |
|---|---|---|---|---|
| | BFG-R (ε) | Proposed algorithm (π) | | |
| adaptec1 | 3526272 | 3526149 | 123 | 0.72 |
| adaptec2 | 3276623 | 3276529 | 94 | 1.3 |
| adaptec3 | 9499657 | 9498903 | 754 | 5.67 |
| adaptec4 | 8948261 | 8947968 | 293 | 5.02 |
| adaptec5 | 10184400 | 10183905 | 495 | 5.94 |
| newblue1 | 2395542 | 2395474 | 68 | 1.96 |
| newblue2 | 4635522 | 4635474 | 48 | 1.24 |
| newblue3 | 7503314 | 7503195 | 119 | 5.56 |
| newblue4 | 8162434 | 8162311 | 123 | 5.93 |
| newblue5 | 14614155 | 14613918 | 237 | 9.78 |
| newblue6 | 10151299 | 10151223 | 76 | 9.87 |
| newblue7 | 18371163 | 18371128 | 35 | 5.82 |
| bigblue1 | 3682974 | 3682780 | 194 | 0.88 |
| bigblue2 | 4740046 | 4739568 | 478 | 4.20 |

TABLE VI-continued

RESULTS OF THE ENHANCEMENT OF WIRE-LENGTH OF SOLUTIONS OF NCTU-GR 2.0 [1]

| Problem | Wire-lengths (# of edges) | | Minimization in wire-length | runtime (η) (hrs) |
|---|---|---|---|---|
| | BFG-R (ε) | Proposed algorithm (π) | | |
| bigblue3 | 7843211 | 7843048 | 163 | 9.44 |
| bigblue4 | 11956300 | 11956233 | 67 | 8.23 |

Figure 7:
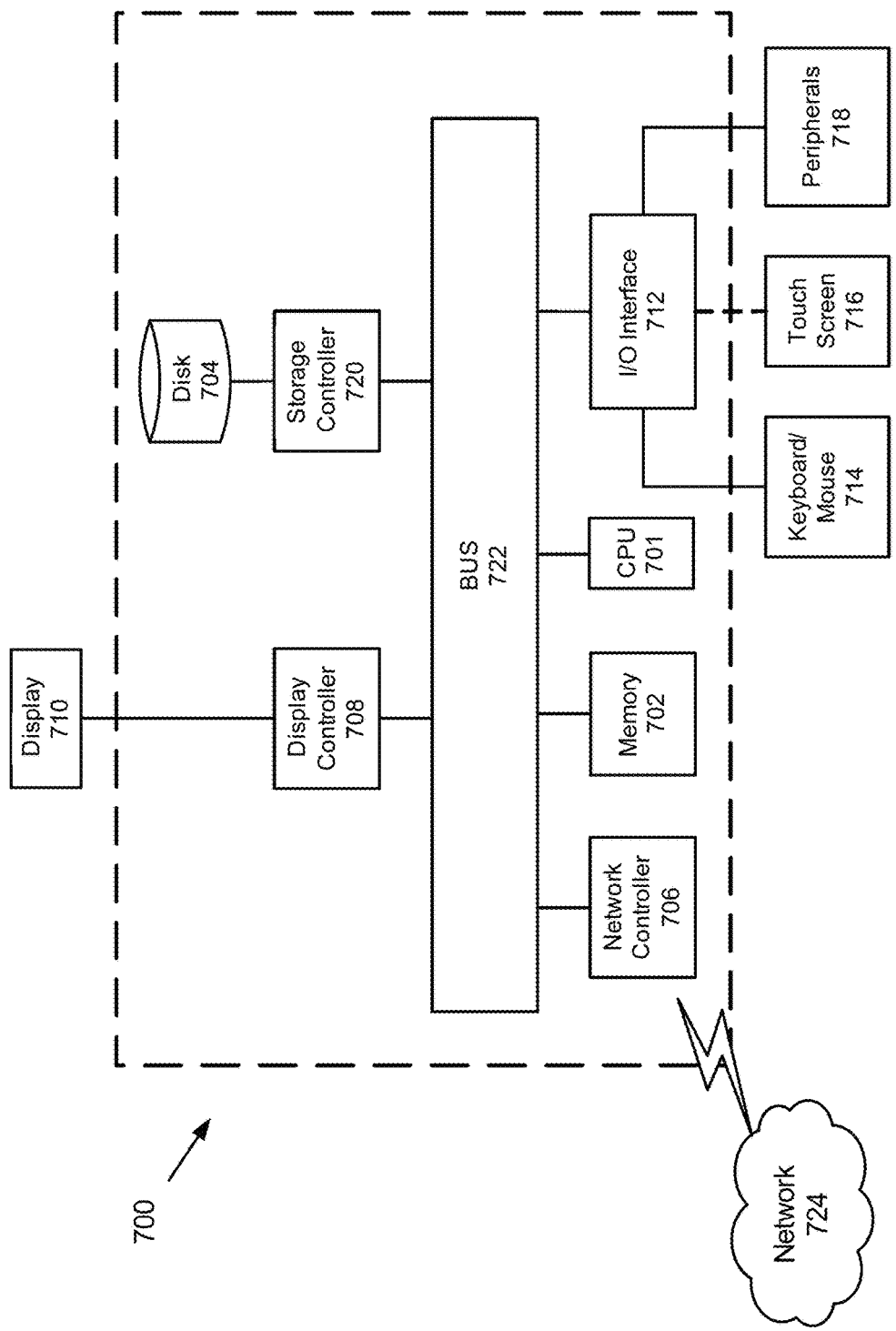
FIG. 7 is a block diagram of a hardware description of a computer according to one embodiment.

FIG. 7 is a block diagram of a hardware description of a computer 700 used in exemplary embodiments. In the embodiments, computer 700 can be a desk top, laptop, or server. Computer 700 could be used as the R&R processor 306, the initial router 301, and/or the MRF 320.

In FIG. 7, the computer 700 includes a CPU 701 which performs the processes described herein. The process data and instructions may be stored in memory 702. These processes and instructions may also be stored on a storage medium disk 704 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 700 communicates, such as a server or computer.

Further, the claimed advancements may be provided as a utility application, background daemon, or component of an operating system, or combination thereof, executing in conjunction with CPU 701 and an operating system such as Microsoft® Windows®, UNIX®, Oracle ® Solaris, LINUX® Apple macOS® and other systems known to those skilled in the art.

In order to achieve the computer 700, the hardware elements may be realized by various circuitry elements, known to those skilled in the art. For example, CPU 701 may be a Xenon® or Core® processor from Intel Corporation of America or an Opteron® processor from AMD of America, or may be other processor types that would he recognized by one of ordinary skill in the art. Alternatively, the CPU 701 may be implemented on an FPGA, ASIC, PLD or using discrete logic circuits, as one of ordinary skill in the art would recognize Further, CPU 701 may be implemented as multiple processors cooperatively working in parallel to perform the instructions of the inventive processes described above.

The computer 700 in FIG. 7 also includes a network controller 706, such as an Intel Ethernet PILO network interface card from Intel Corporation of America, for interfacing with network 724. As can he appreciated, the network 724 can be a public network, such as the Internet, or a private network such as LAN or WAN network, or any combination thereof and can also include PSTN or ISDN sub-networks. The network 724 can also be wired. such as an Ethernet network, or can be wireless such as a cellular network including EDGE, 3G and 4G wireless cellular systems. The wireless network can also be WiFi®, Bluetooth®, or any other wireless form of communication that is known.

The computer 700 further includes a display controller 708, such as a NVIDIA® GeForce® GTX or Quadro® graphics adaptor from NVIDIA Corporation of America for interfacing with display 710, such as a Hewlett Packard® HPL2445w LCD monitor. A general purpose I/O interface 712 interfaces with a keyboard and/or mouse 714 as well as an optional touch screen panel 716 on or separate from display 710. General purpose I/O interface 712 also connects to a variety of peripherals 718 including printers and scanners, such as an Officeet® or DeskJet® from Hewlett Packard.

The general purpose storage controller 720 connects the storage medium disk 704 with communication bus 722, which may be an ISA, EISA, VESA, PCI, or similar, for interconnecting all of the components of the computer 700. A description of the general features and functionality of the display 710, keyboard and/or mouse 714, as well as the display controller 708, storage controller 720, network controller 706, and general purpose I/O interface 712 is omitted herein for brevity as these features are known.

Figure 8:
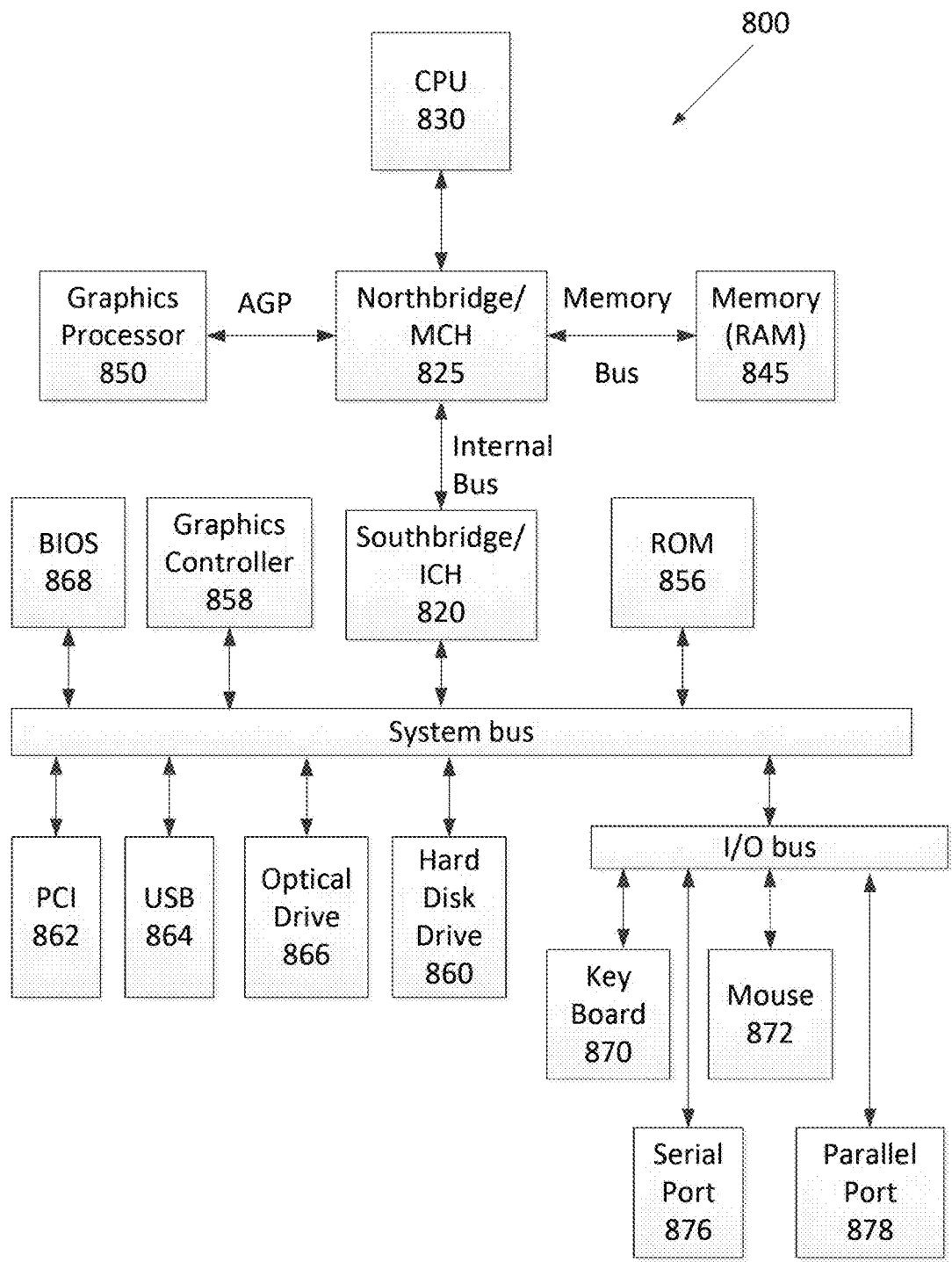
FIG. 8 is a schematic diagram of an exemplary data processing system according to one embodiment.

FIG. 8 is a schematic diagram of an exemplary data processing system. The data processing system is an example of a computer in which code or instructions implementing the processes of the illustrative embodiments can be located.

In FIG. 8, data processing system 800 employs an application architecture including a north bridge and memory controller hub (NB/MCH) 825 and a south bridge and input/output (I/O) controller hub (SB/ICH) 820. The central processing unit (CPU) 830 is connected to NB/MCH 825. The NB/MCH 825 also connects to the memory 845 via a memory bus, and connects to the graphics processor 850 via an accelerated graphics port (AGP). The NB/MCH 825 also connects to the SB/ICH 820 via an internal bus (e.g., a unified media interface or a direct media interface). The CPU 830 can contain one or more processors and even can be implemented using one or more heterogeneous processor systems.

Figure 9:
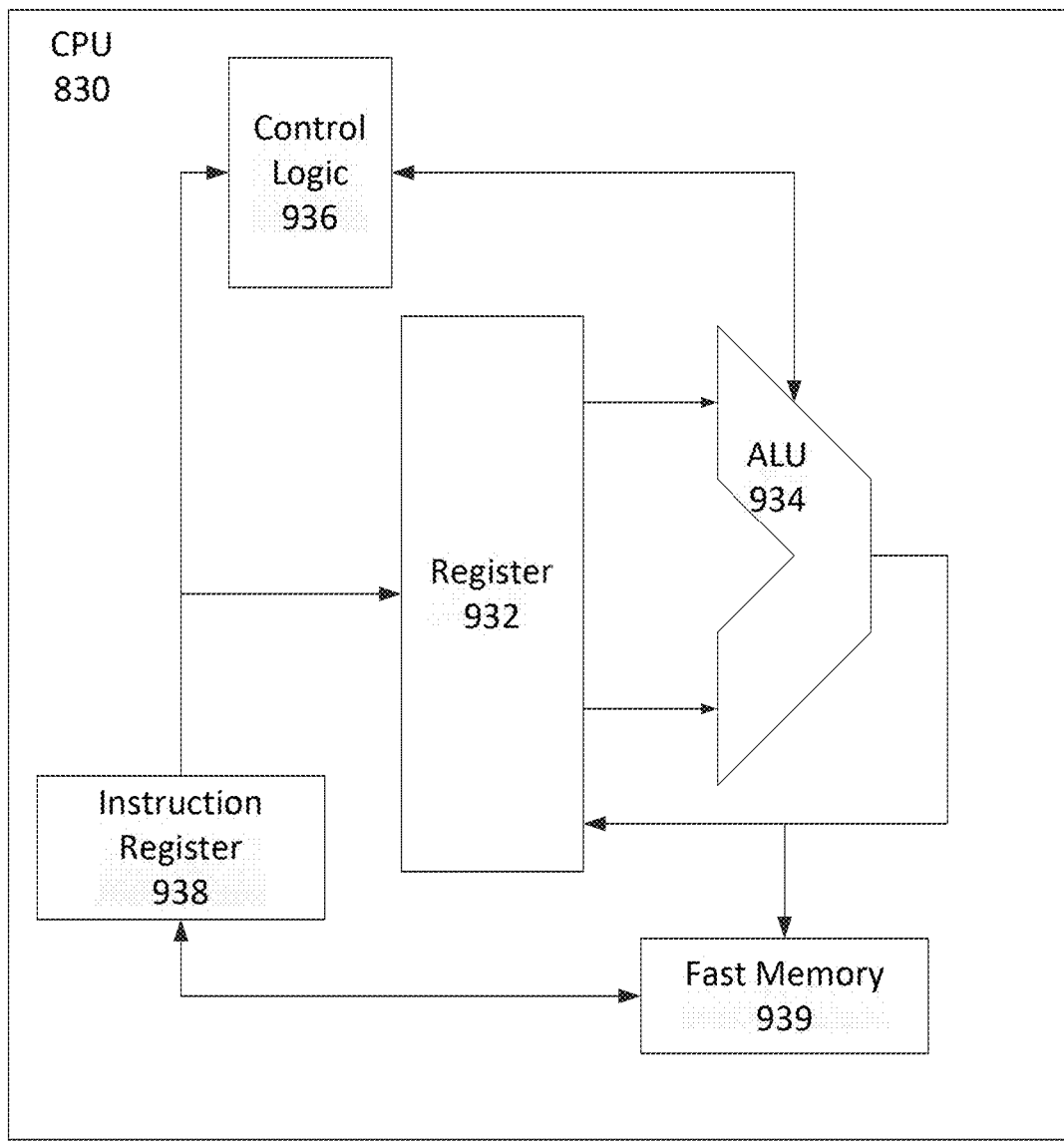
FIG. 9 illustrates an implementation of a CPU according to one embodiment.

FIG. 9 illustrates an implementation of CPU 830. In one implementation, an instruction register 938 retrieves instructions from a fast memory 939. At least part of these instructions are fetched from an instruction register 938 by a control logic 936 and interpreted according to the instruction set architecture of the CPU 830. Part of the instructions can also be directed to a register 932. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using an arithmetic logic unit (ALU) 934 that loads values from the register 932 and performs logical and mathematical operations on the loaded values according to the instructions. The results from these operations can be fed back into the register 932 and/or stored in a fast memory 939. According to aspects of the disclosure, the instruction set architecture of the CPU 830 can use a reduced instruction set computer (RISC), a complex instruction set computer (CISC), a vector processor architecture, or a very long instruction word (VLIW) architecture. Furthermore, the CPU 830 can be based on the Von Neuman model or the Harvard model. The CPU 830 can be a digital signal processor, an FPGA, an ASIC, a PLA, a PLD, or a CPLD. Further, the CPU 830 can be an x86 processor by Intel or by AMD; an ARM processor: a Power architecture processor by, e.g., IBM; a SPARC architecture processor by Sun Microsystems or by Oracle; or other known CPU architectures.

Referring again to FIG. 8, the data processing system 800 can include the SIVICH 820 being coupled through a system bus to an I/O Bus, a read only memory (ROM) 856, universal serial bus (USB) port 864, a flash binary input/output system (BIOS) 868. and a graphics controller 858. PCI/PCIe devices can also be coupled to SIS/ICH 820 through a PCI bus 862.

The PCI devices can include, for example Ethernet adapters, add-in cards, and PC cards for notebook computers. The Hard disk drive 860 and CD-ROM 866 can use, for example, an integrated drive electronics (IDE) or serial advanced technology attachment (SATA) interface. In one implementation the I/O bus can include a super I/O (SIO) device.

Further, the hard disk drive (HDD) 860 and optical drive 866 can also be coupled to the SB/ICH 820 through a system bus. In one implementation, a keyboard 870, a mouse 872, a parallel port 878, and a serial port 876 can be connected to the system bus through the I/O bus. Other peripherals and devices can be connected to the SB/ICH 820 using a mass storage controller such as SATA or PATA, an Ethernet port, an ISA bus, a LPC bridge, SMBus, a DMA controller, and an Audio Codec.

Embodiments described herein can be implemented in conjunction with one or more of the devices described above with reference to FIGS. 7-9. Embodiments are a combination of hardware and software, and processing circuitry by which the software is implemented.

FIG. 10 is a flow of execution of the R&R processor 302 using a pseudo code when input aim="Total-overflow". In step S1010, termination criterion based on a maximum allowed is computed. In step S1010, if the current iteration is not the first iteration, then stopping the criterion based on the NE is also computed using the NE-based terminator 328. In step S1020, the order of nets in IV is permitted using the nets permute operator 309. In S1030, a net is selected using the net Selector 308. In step S1040, the mixed strategy for the net is computed using the available strategies block 322 and the mixed strategist 324. In step S1050, a GT pure strategy for the net is selected using the strategy selector 326. In S1060, the net is ripped-up and re-routed using the R&R operator 310 and the maze router 304 and the spanning tree is stored in $t^*_i$. . . In Step S1070, ofl($n^*_i$) is the overflow of n, when its spanning tree is $t^*_i$ and ofl($n_i$) is the overflow of $n_i$ when its spanning tree is $t_i$. Based on the comparison in S1070, the solution is overwritten by the new solution using the solution updater 306.

FIG. 11 is a flow of execution of the R&R processor 302 using a pseudo code when input aim="Total wire-length". Termination criterion based on a maximum allowed time is computed. In S2010, if the current iteration is not the first iteration, then stopping criterion based on NE is also computed using the NE-based terminator 328. In step S2020, the order of nets in N is permuted using the nets permute operator 309. In step S2030, the mixed strategy for the net is computed using the available strategies block 322 and the mixed strategist 324. In step S2040, a GT pure strategy for the net is selected using the strategy selector 326. In S2050, the net is ripped-up and re-routed using the R&R operator 310 and the maze router 304.

Figure 12:
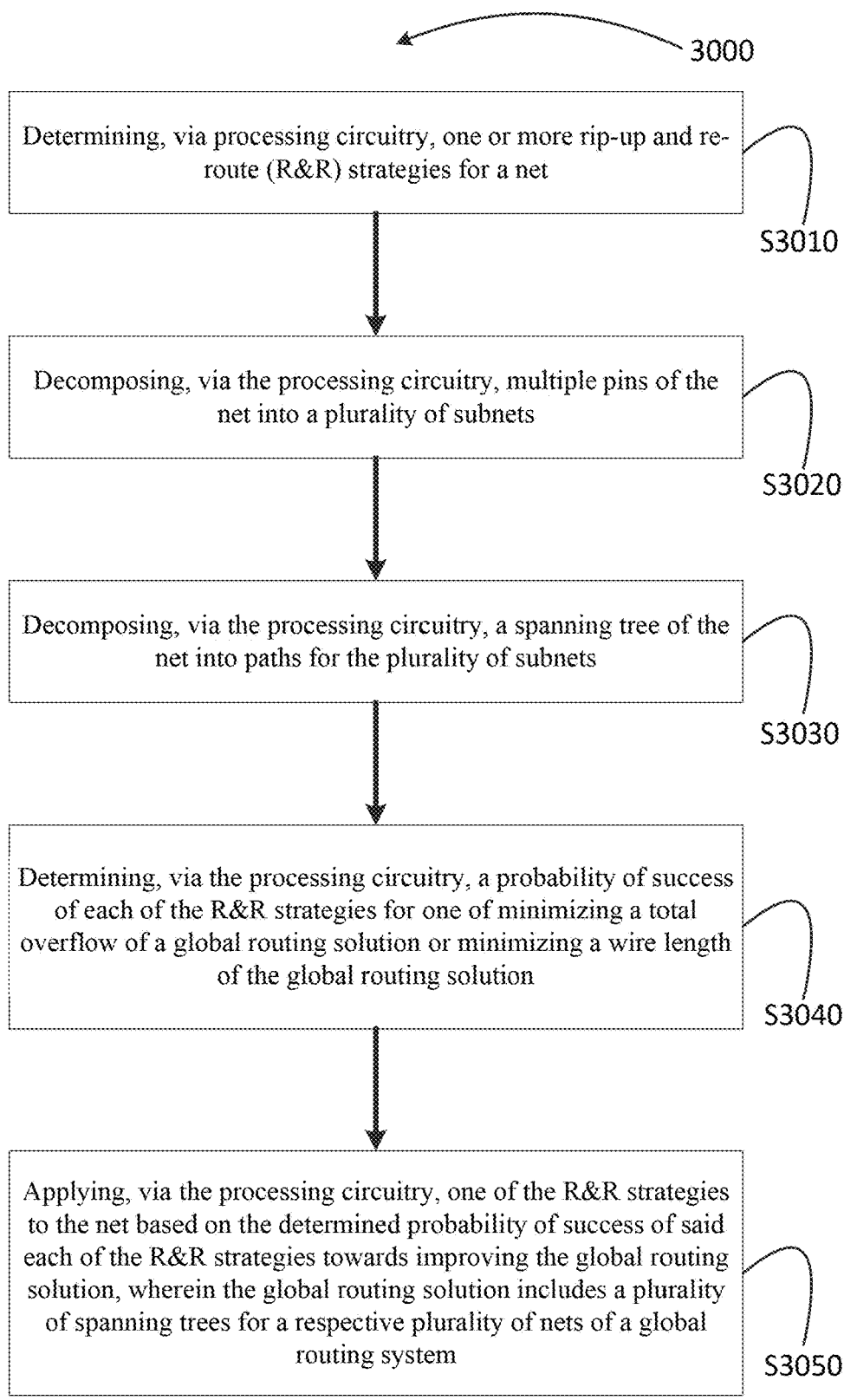
FIG. 12 is a flowchart for an exemplary method of global routing according to one embodiment.

FIG. 12 is a flowchart for an exemplary method 3000 of global routing. In step S3010, one or more R&R strategies are determined for a net, via processing circuitry. In step S3020, multiple pins of the net are decomposed into a plurality of subnets, via the processing circuitry. In step S3030, a spanning tree of the net is decomposed into paths for the plurality of subnets, via the processing circuitry. In step S3040. a probability of success is determined of each of the R&R strategies for one of minimizing a total overflow of a global routing solution or minimizing a wire length of the global routing solution. In step S3050, one of the R&R strategies is applied to the net based on the determined probability of success of said each of the R&R strategies towards improving the global routing solution, via the processing circuitry. The global routing solution includes a plurality of spanning trees for a respective plurality of nets of a global routing system.

Embodiments herein describe GT-based algorithms that can enhance the solutions of existing global routers. The GT-based algorithms model the R&R process as a game whose objective can be either to minimize the total overflow or the wire length of a global routing solution. In the game, the nets act as players and their set of pure strategies includes several different ND-RT methods. Each ND-RT method includes three steps: (i) net decomposition, GO rip-up, and (iii) re-routing. The nets select a technique or strategy based on game theory to rip-up and re-route their spanning trees.

The payoff of any pure strategy is the improvement which it can bring in the overflow or wire length. The nets use mixed strategies. The mixed strategy of a net is a set which contains probabilities with which it can select any of its pure strategies. The probabilities are computed based on the likelihood of the corresponding strategy to improve the solution. The performance of the GT-based algorithms was evaluated by using it to enhance two global routers. The experimental results showed that it can minimize total overflow and/or wire length from the solutions of existing global routers to values in which those routers cannot reach on their own.

The embedding of GT with these techniques produce better global routers due to exploration of more possible solutions and more intelligent decision making to keep runtime small. The performance of the GT-based algorithms provides improved processing by performing parameter optimization and adding new strategies.

Some current methods for global routing employ just one method to rip-up and re-route a net. However, embodiments described herein employ up to four different methods to rip-up and re-route the nets. Some current methods also specify a method in which to select the nets to be ripped-up and re-routed until the solution becomes congestion-free. However, embodiments described herein do not use any method to select the nets. Instead, embodiments described herein include a method for the nets to select a proper technique based on game theory to rip-up and re-route their respective spanning trees. Embodiments described herein also provide global routing methods to minimize total overflow and also to minimize the wire length of a given global routing solution.

Embodiments described herein include the following aspects.

(1) A method of global routing includes determining, via processing circuitry, one or more rip-up and re-route (R&R) strategies for a net; decomposing, via the processing circuitry, multiple pins of the net into a plurality of subnets; decomposing, via the processing circuitry, a spanning tree of the, net into paths for the plurality of subnets; determining, via the processing circuitry, a probability of success of each of the R&R strategies for one of minimizing a total overflow of a global routing solution or minimizing a wire length of the global routing solution; and applying, via the processing circuitry, one of the R&R strategies to the net based on the determined probability of success of said each of the R&R strategies towards improving the global routing solution, wherein the global routing solution includes a plurality of spanning trees for a respective plurality of nets of a global routing system.

(2) The method of global routing of (1), wherein decomposing multiple pins of the net into the plurality of subnets is based on generating a rectilinear minimal spanning tree (RMST).

(3) The method of global routing of either one of (1) or (2), wherein applying said one of the R&R strategies includes ripping up the spanning tree by deleting paths of one or more of the plurality of subnets, and re-routing the net by generating new paths for the deleted paths.

(4) The method of, global routing of any one of (1) through (3), further includes iterating the method, wherein each iteration includes permuting an order in which a plurality of nets select and play their strategies, wherein the plurality of nets select a respective strategy and apply that strategy to enhance the respective spanning tree; and ending the iterating when one of a maximum runtime has occurred or a Nash Equilibrium has been reached.

(5) The method of global routing of any one of (1) through (4), wherein said one or more R&R strategies for minimizing the total overflow of the global routing solution include a partial R&R strategy in which only branches of the spanning tree which have a congested edge are ripped-up and re-routed.

(6) The method of global routing of any one of (1) through (5), wherein the partial R&R strategy includes a partial R&R in a two-pin maze routing with framing (PRR-Two-Pins MRF) strategy.

(7) The method of global routing of any one of (1) through (6), wherein the partial R&R strategy includes a partial R&R in a multiple-pin MRF (PRR-Multi-Pin MRF) strategy.

(8) The method of global routing of any one of (1) through (7), wherein the partial R&R strategy includes a minimum congestion partial R&R in a two-pin MRF (MC-PRR-Two-Pins MRF) strategy.

(9) The method of global routing of any one of (1) through (8), wherein the partial R&R strategy includes a random selection partial R&R in a two-pin MRF (RS-PRR-Two-Pins MRF) strategy.

(10) The method of global routing of any one of (1) through (9), wherein said one or more R&R strategies for minimizing the wire length of the global routing solution includes an R&R in a two-pin maze routing hr length improvement (RR-Two-Pins MRL) strategy.

(11) The method of global routing of any one of (1) through (10), wherein said one or more R&R strategies for minimizing the wire length of the global routing solution includes a minimum congestion R&R in a two-pin MRL (MC-RR-Two-Pins MRL) strategy.

(12) The method of global routing of any one of (1) through (11), wherein said one or more R&R strategies for minimizing the wire length of the global routing solution includes a random selection R&R in a two-pin MRL (RS-RR-Two-Pins MRL) strategy.

(13) A system of global routing includes processing circuitry configured to determine one or more rip-up and re-route (R&R) strategies for a net; decompose multiple pins of the net into a plurality of subnets; decompose a spanning tree of the net into paths for the plurality of subnets: determine a probability of success of each of the R&R strategies for one of minimizing a total overflow of a global routing solution or minimizing a wire length of the global routing solution; select one of the R&R strategies to the net based on the determined probability of success of said each of the R&R strategies towards improving the global routing solution; and apply the selected R&R strategy to improve the spanning tree of the nets wherein the global routing solution includes a plurality of spanning trees for a respective plurality of nets of a global routing system.

(14) The system of global routing of (13), wherein said one or more R&R strategies for minimizing the total overflow of the global routing solution include a partial R&R strategy in which only branches of the spanning tree which have a congested edge are ripped-up and re-routed.

(15) The system of global routing of either one of (13) or (14), wherein the partial R&R strategy for minimizing the total overflow of the global routing solution includes at least one of a partial R&R in a two-pin maze routing with framing (PRR-Two-Pins MRF) strategy, a partial R&R in a multiple-pin MRF MRF) strategy, a minimum congestion partial R&R in,a two-pin MRF (MC-PRR-Two-Pins MRF) strategy, and a random selection partial R&R in a two-pin MRF (RS-PRR-Two-Pins MRF) strategy.

(16) The system of global routing of any one of (13) through (15), wherein said one or more R&R strategies for minimizing the wire length of the global routing solution include at least one of an R&R in a two-pin maze routing for length improvement (RR-Two-Pins MRL) strategy, a minimum congestion R&R in a two-pin MRL (MC-RR-Two-Pins MRL) strategy. and a random selection R&R in a two-pin MRL (RS-RR-Two-Pins MRL) strategy.

(17) The system of global routing of any one of (13) through (16), further includes an initial router configured to order and route a plurality of nets within the spanning tree; a maze router with framing configured to determine the R&R strategy to a global routing problem; and an R&R processor configured with a nets selector, a game theorizer, an R&R operator, and a parameter values updater.

(18) The system of global routing of any one of (13) through (17), wherein decomposing multiple pins of the net includes generating a rectilinear minimal spanning tree (RMST).

(19) The system of global routing of any one of (13) through (18), wherein the circuitry is further configured to rip-up the spanning tree by deleting paths of one or more of the plurality of subnets; and re-route the net by generating new paths for the deleted paths.

(20) The system of global routing of any one of (13) through (19), wherein the circuitry is further configured to perform a series of iterations in which each iteration includes permuting an order in which a plurality of nets select and play their strategies, wherein the plurality of nets select a respective strategy and apply that strategy to enhance the respective spanning tree; and ending the series of iterations when one of a maximum runtime has occurred or a Nash Equilibrium has been reached.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes, and algorithms described herein may be performed in hardware or software executed by hardware, including computer processors and/or programmable circuits configured to execute program code and/or computer instructions to execute the ftmctions, processes, and algorithms described herein. Additionally, an implementation may be performed on modules or hardware not identical to those described. Accordingly, other implementations are within the scope that may be claimed.

The foregoing discussion describes merely exemplaty embodiments of the present disclosure. As will be understood by those skilled in the art, the present disclosure may be embodied in other specific forms without departing from the spirit or essential characteristics thereof Accordingly, the disclosure is intended to be illustrative, but not limiting of the scope of the disclosure, as well as the claims. The disclosure, including any readily discernible variants of the teachings herein, defines in part, the scope of the foregoing claim terminology such that no inventive subject matter is dedicated to the public.

The invention claimed is:

1. A method of global routing, the method comprising:
   determining, via processing circuitry, one or more rip-up and re-route (R&R) strategies for a net;
   decomposing, via the processing circuitry, multiple pins of the net into a plurality of subnets;
   decomposing, via the processing circuitry, a spanning tree of the net into paths for the plurality of subnets;
   determining, via the processing circuitry, a probability of success of each of the R&R strategies for one of minimizing a total overflow of a global routing solution, or minimizing a wire length of the global routing solution; and
   applying, via the processing circuitry,one of the R&R strategies to the net based on the determined probability of success of said each of the R&R strategies towards improving the global routing solution,
   wherein the global routing solution includes a plurality of spanning trees for a respective plurality of nets of a global routing system.

2. The method of claim I, wherein decomposing multiple pins of the net into the plurality of subnets is based on generating a rectilinear minimal spanning tree (RMST).

3. The method of claim 1, wherein applying said one of the R&R strategies includes:
   ripping up the spanning tree by deleting paths of one or more of the plurality of subnets; and
   re-routing the net by generating new paths for the deleted paths.

4. The method of claim 1, further comprising:
   iterating the method, wherein each iteration includes
      permuting an order in which a plurality of nets select and play their strategies, wherein the plurality of nets select a respective strategy and apply that strategy to enhance the respective spanning tree; and
      ending the iterating when one of a maximum, runtime has occurred or a Nash Equilibrium has been reached.

5. The method of claim 1, wherein said one or more R&R strategies for minimizing the total overflow of the global routing solution include a partial R&R strategy in which only branches of the spanning tree which have a congested edge are ripped-up and re-routed.

6. The method of claim 5, wherein the partial R&R strategy includes a partial R&R in a two-pin maze routing with framing (PRR-Two-Pins MRF) strategy.

7. The method of claim 5, wherein the partial R&R strategy includes a partial R&R in a multiple-pin MRF (PRR-Multi-Pin MRF) strategy.

8. The method of claim 5, wherein the partial R&R strategy includes a rninimu congestion partial R&R in a two-pin MRF (MC-PRR-Two-Pins MRF) strategy.

9. The method of claim 5, wherein the partial R&R strategy includes a random selection partial R&R in a two-pin MRF (RS-PRR-Two-Pins MRF) strategy.

10. The method of claim 1, wherein said one or more R&R strategies for minimizing the wire length of the global routing solution includes an R&R in a two-pin amaze routing for length improvement (RR-Two-Pins MRL) strategy.

11. The method of claim 1, wherein said one or more R&R strategies for minimizing the wire length of the global routing solution includes a minimum congestion R&R in a two-pin maze routing, for length improvement (MC-RR-Two-Pins MRL) strategy.

12. The method of claim 1, wherein said one or more R&R strategies for minimizing the wire length of the global routing solution includes a random selection R&R in a two-pin maze routing for length improvement (RS-RR-Two-Pins MRL) strategy.

13. A system of global routing, the system comprising:
processing circuitry configured to
determine one or more rip-up and re-route (R&R) strategies for a net;
decompose multiple pins of the net into a plurality of subnets;
decompose a spanning tree of the net into paths for the plurality of subnets;
determine a probability of success of each of the R&R strategies for one of minimizing a total overflow of a global routing solution or minimizing a wire length of the global routing solution;
select one of the R&R strategies to the net based on the determined probability of success of said each of the R&R strategies towards improving the global routing solution; and
apply the selected R&R strategy to improve the spanning tree of the net,
wherein the global routing solution includes a plurality of spanning trees for a respective plurality of nets of a global routing system.

14. The system of claim 13, wherein said one or more R&R strategies for minimizing the total overflow of the global routing solution include a partial R&R strategy in which only branches of the spanning tree which have a congested edge are ripped-up and re-routed.

15. The system of claim 14, wherein the partial R&R strategy for minimizing the total overflow of the global routing solution includes at least one of a partial R&R in a two-pin maze routing with framing (PRR-Two-Pins MRF) strategy, a partial R&R in a multiple-pin MRF (PRR-Multi-Pin MRF) strategy, a minimum congestion partial R&R in a two-pin MRF (MC-PRR-Two-Pins MRF) strategy, and a random selection partial R&R in a two-pin MRF (RS-PRR-Two-Pins MRF) strategy.

16. The system of claim 13, wherein said one or more R&R strategies for minimizing the wire length of the global routing solution include at least one of an R&R in a two-pin maze routing for length improvement (RR-Two-Pins MRL) strategy, a minimum congestion R&R in a two-pin MRL (MC-RR-Two-Pins MRL) strategy, and a random selection R&R in a two-pin MRL (RS-RR-Two-Pins MRL) strategy.

17. The system of claim 13, further comprising:
an initial router configured to order and route a plurality of nets within the spanning tree;
a maze router with framing configured to determine the R&R strategy to a global routing problem; and
an R&R processor configured with a nets selector, a game theorizer, an R&R operator. and a parameter values updater.

18. The system of claim 13, wherein decomposing multiple pins of the net includes generating a rectilinear minimal spanning tree (RMST).

19. The system of claim 13, wherein the circuitry is further configured to:
rip-up the spanning tree by deleting paths of one or more of the plurality of subnets; and
re-route the net by generating new paths for the deleted paths.

20. The system of claim 13, wherein the circuitry is further configured to:
perform a series of iterations in which each iteration includes,
permuting an order in which a plurality of nets select and play their strategies, wherein the plurality of nets select a respective strategy and apply that strategy to enhance the respective spanning tree; and
ending the series of iterations when one of a maximum runtime has occurred or a Nash Equilibrium has been reached.

* * * * *